(12) United States Patent
Otsuka et al.

(10) Patent No.: US 6,812,742 B2
(45) Date of Patent: Nov. 2, 2004

(54) ELECTRONIC DEVICE

(75) Inventors: Kanji Otsuka, 1074-38, Kohan 2-chome, Higashiyamato-shi, Tokyo 207-0002 (JP); Tamotsu Usami, 38-4, Nishimachi 2-chome, Kokubunji-shi, Tokyo, 185-0035 (JP)

(73) Assignees: Kanji Otsuka, Higashiyamato (JP); Tamotsu Usami, Kokubunji (JP); Fujitsu Limited, Kawasaki (JP); Oki Electric Industry Co., Ltd., Tokyo (JP); SANYO Electric Co., Ltd., Osaka (JP); Sharp Kabushiki Kaisha, Osaka (JP); Sony Corporation, Tokyo (JP); Kabushiki Kaisha Toshiba, Tokyo (JP); NEC Corporation, Tokyo (JP); Hitachi, Ltd., Tokyo (JP); Matsushita Electric Industrial Co., Ltd., Osaka (JP); Mitsubishi Denki Kabushiki Kaisha, Tokyo (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/307,521

(22) Filed: Dec. 2, 2002

(65) Prior Publication Data

US 2003/0132821 A1 Jul. 17, 2003

(30) Foreign Application Priority Data

Dec. 3, 2001 (JP) .................................... 2001-369358

(51) Int. Cl.$^7$ ............................................. H03K 19/0175
(52) U.S. Cl. ............................ 326/83; 326/30; 326/47; 326/82; 326/86; 326/101; 326/102; 326/103
(58) Field of Search ..................... 326/30, 47, 82–83, 326/86, 101–103; 333/1

(56) References Cited

U.S. PATENT DOCUMENTS 5,214,318 A * 5/1993 Nakanishi et al. .......... 326/124
6,522,173 B1 * 2/2003 Otsuka ........................ 326/101
6,570,463 B1 * 5/2003 Nedachi ....................... 333/20

FOREIGN PATENT DOCUMENTS

| JP | 11284126 A | * | 10/1999 | ........... H01L/25/16 |
| JP | 2000174505 A | * | 6/2000 | ............. H01P/1/26 |
| JP | 2001211211 A | * | 8/2001 | ........... H04L/25/02 |

* cited by examiner

*Primary Examiner*—Jean Jeanglaude
*Assistant Examiner*—Nguyen Khai
(74) *Attorney, Agent, or Firm*—Arent Fox PLLC

(57) ABSTRACT

An electronic device having a current switch type driver is provided. The current switch type driver includes a differential circuit that supplies a current to a transmission channel according to a signal. In the electronic device, a signal wire that transmits the signal to the differential circuit has a transmission channel structure.

23 Claims, 20 Drawing Sheets

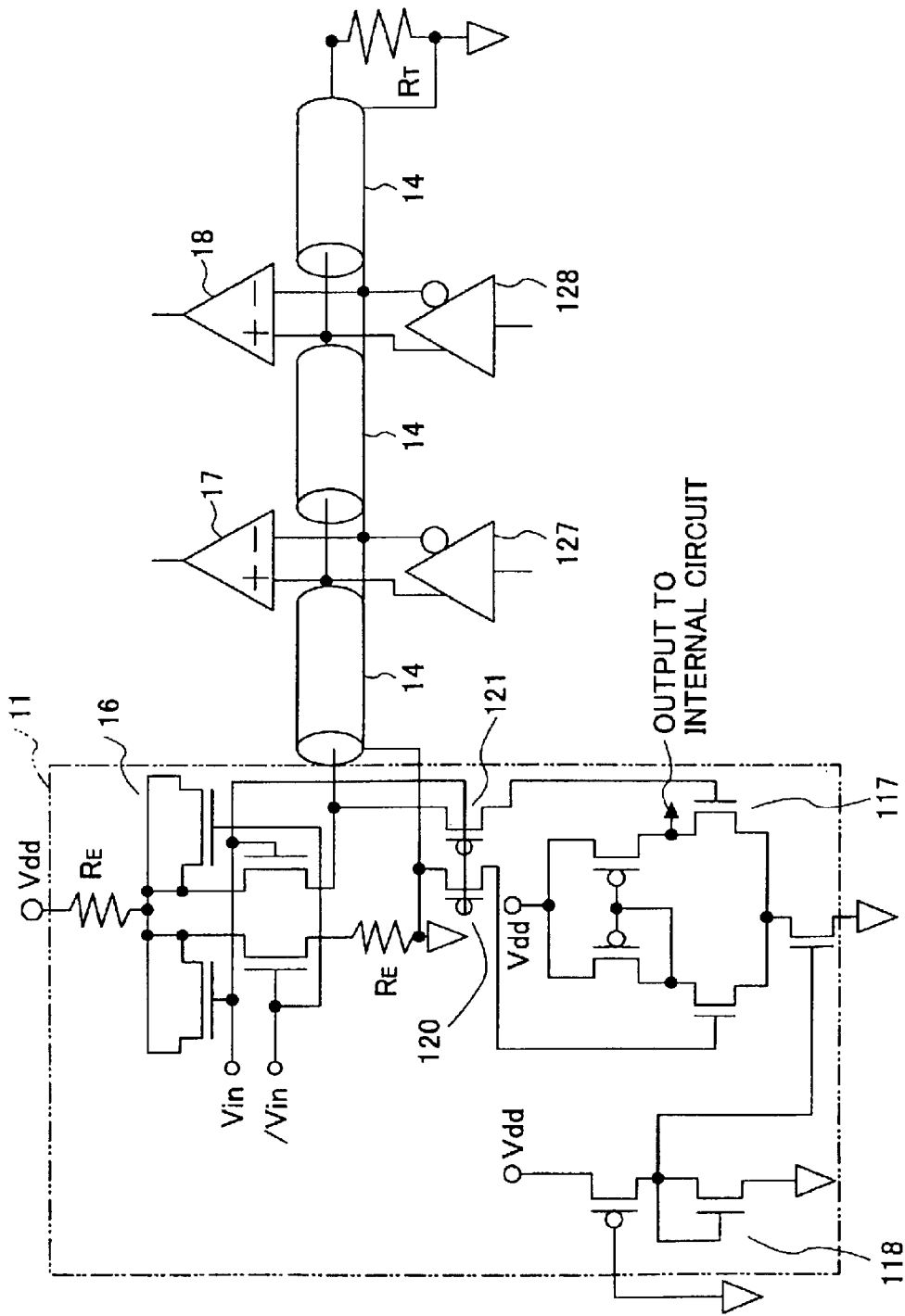

ELECTRONIC DEVICE

BACKGROUND OF THE INVENTION

1. Field of the Invention

The present invention relates to an electronic device having a transmission circuit transmitting a digital signal output by a driver to a transmission channel, and more particularly to technology for performing high-speed transmission in the GHz and higher bands.

2. Description of the Related Art

Recently, a clock frequency for operating an IC chip made according to the LSI technology reaches 2 GHz. On the other hand, the frequency of a transmission channel (bus) for transmitting/receiving a signal to/from the IC chip is, at the maximum, no more than 500 MHz, approximately. Thus, the bandwidth for transmitting/receiving the signal is extremely low compared with the operating frequency of the IC chip. Accordingly, the current status is that the I/O bandwidth for transmitting/receiving the signal to/from the IC chip is lacking. For this reason, a cache memory is provided to the IC chip such as a logic chip or a memory chip so as to assure high-speed signal processing inside the IC chip, and at the same time to compensate the lack of the bandwidth of the transmission channel.

However, by mounting the cache memory to the IC chip, not only a wide chip area is required but also additional address calculation of the cache memory is required. Thus, the architecture becomes complex. If an I/O bandwidth matching the operation clock of the IC chip can be secured, since the cache memory is not required, a system having a simple architecture can be achieved. A basic configuration of a digital system is that the number of I/Os of the IC chip should be essentially the same as the number of processing bits inside the chip. Thus, in order to match the bandwidth with the operation clock frequency, the operation clock of the IC chip and the clock (bus clock) of the transmission channel connected to the I/O must have the same frequency. In the days ahead of running in the age of the GHz band, there is an urgent need to improve the signal transmission connecting between the chips. The signal transmission in the GHz band can be realized by not only by providing a transmission channel that can operate in the GHz band, but also by a configuration in which a whole system including components such as a driver and receiver connected to the transmission channel can transmit a high-speed signal.

SUMMARY OF THE INVENTION

Accordingly, it is a general object of the present invention to provide an improved and useful electronic device in which the above-mentioned problems are eliminated.

It is another and more specific object of the present invention to provide an electronic device capable of performing high-speed transmission in the GHz and higher bands.

In order to achieve the above-described objects, according to one aspect of the present invention, there is provided an electronic device having a current switch type driver including a differential circuit that supplies a current to a transmission channel according to a signal, wherein a signal wire transmitting the signal to the differential circuit has a transmission channel structure.

According to the above-mentioned aspect of the present invention, the signal wire has a transmission channel structure. Thus, it is possible to decrease parasitic inductance and parasitic capacitance to a negligible level. Hence, it is possible to provide an electronic device capable of performing high-speed transmission in the GHz and higher bands.

In addition, it should be noted that the electronic device includes, for example, a single IC chip, a packaged IC chip, and an electronic device in which an IC chip and a packaged electronic device are mounted on a wiring board and connected by a transmission channel.

Other objects, features and advantages of the present invention will become more apparent from the following detailed description when read in conjunction with the following drawings.

BRIEF DESCRIPTION OF THE DRAWINGS

FIG. 20 is a circuit diagram showing a system including an IC chip having both driver and receiver.

DETAILED DESCRIPTION OF THE PREFERRED EMBODIMENTS

Figure 1A:
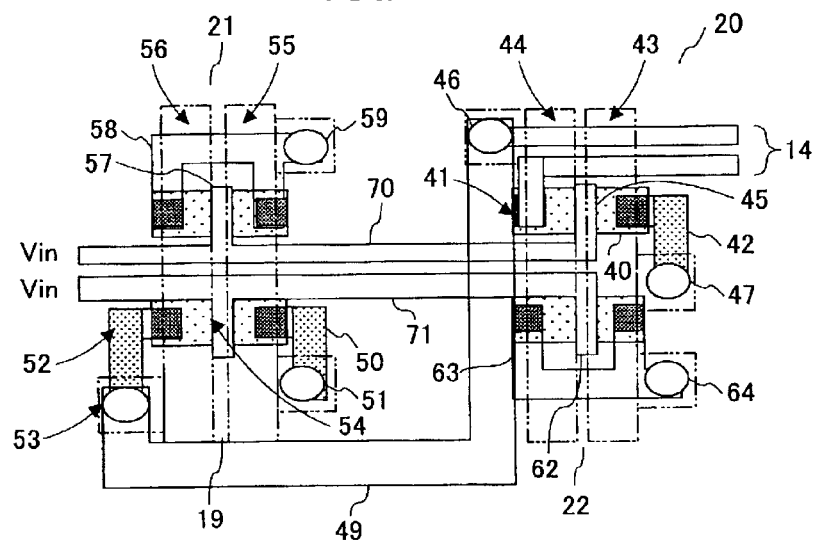
FIG. 1A is a side view showing an electronic device according to one embodiment of the present invention.
Figure 1B:
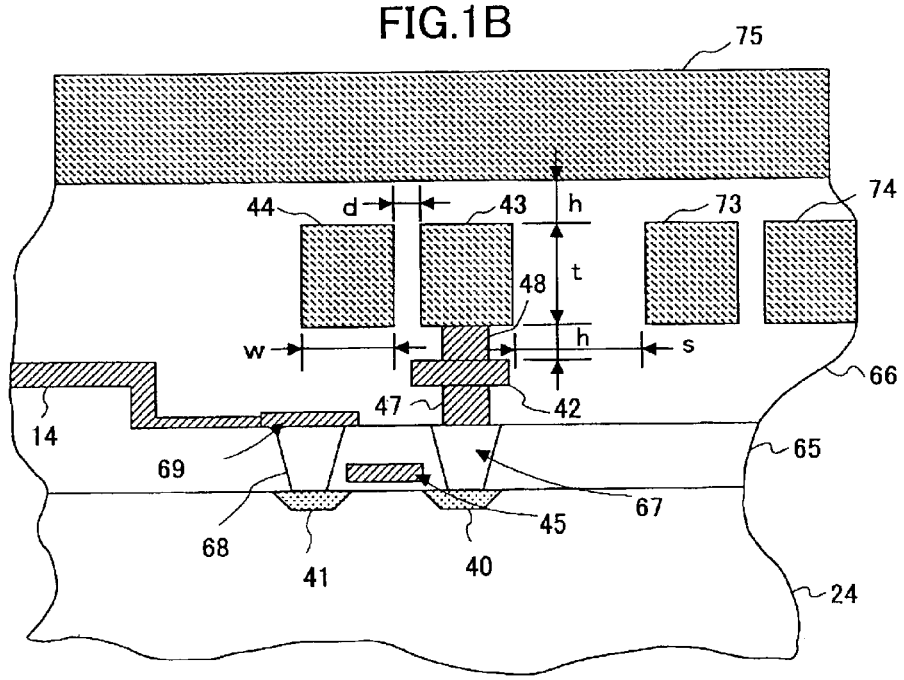
FIG. 1B is a partial cross-sectional view of the electronic device shown in FIG. 1.
Figure 2:
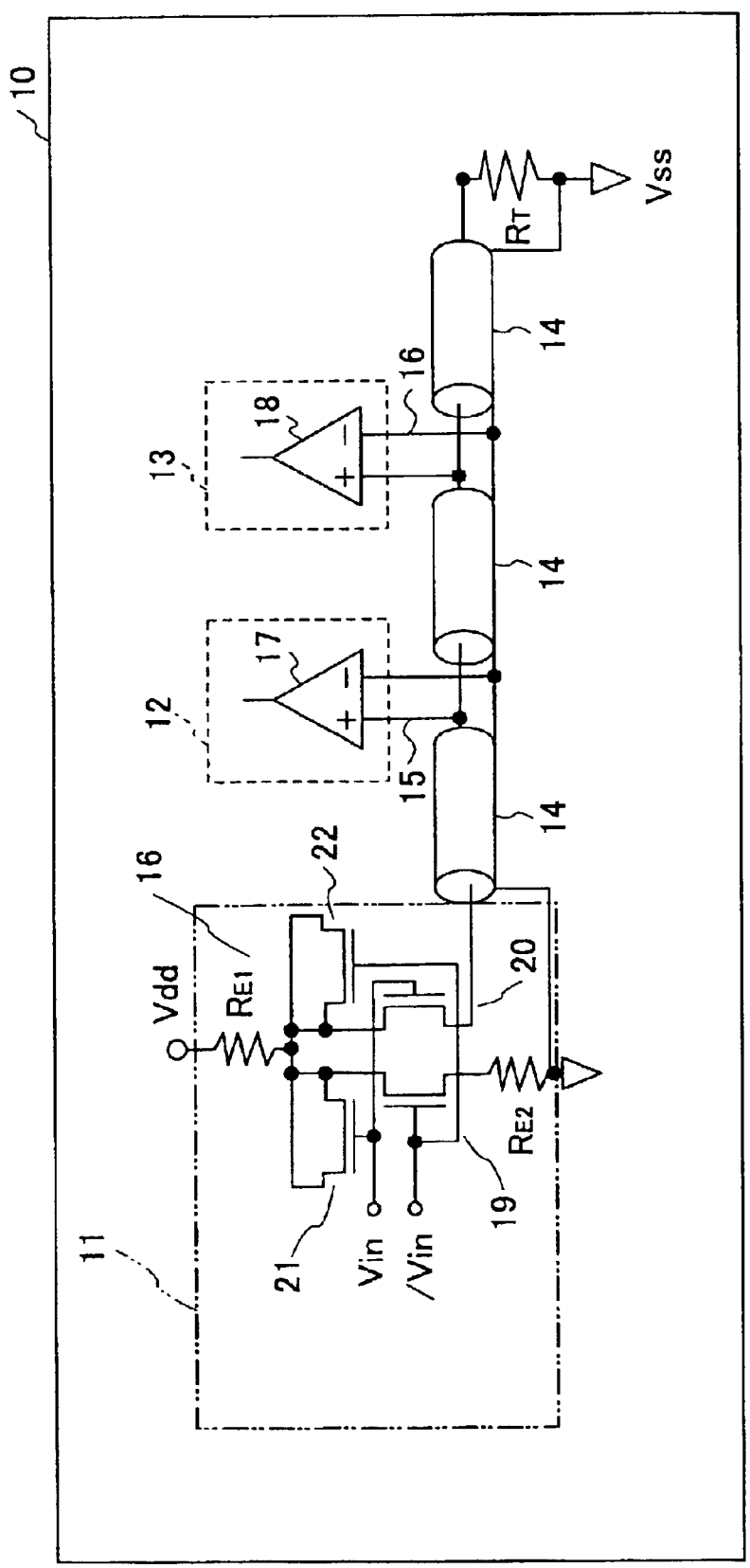
FIG. 2 is a circuit diagram of the electronic device shown in FIG. 1.

FIGS. 1A and 1B are diagrams showing an electronic device according to one embodiment of the present invention. FIG. 1A is a model plan view showing the layout of the electronic device, and FIG. 1B is a cross-sectional view of the layout of FIG. 1A. In addition, FIG. 2 is a circuit diagram of the electronic device 10 shown in FIGS. 1A and 1B. For convenience of explanation, first, a description will be given of the circuit diagram of FIG. 2.

The electronic device according to the embodiment of the present invention includes a wiring board 10. IC chips 11, 12 and 13 are provided on the wiring board 10. The IC chips 11 through 13 are, for example, packaged electronic components having a bare chip or a terminal for external connection. The electronic components constitute the electronic device, and the electronic device according to the present invention includes not only the system structure shown in FIGS. 1A and 1B, but also each of the electronic components such as the IC chips 11 through 13. The IC chip 11 is connected to one end of a transmission channel 14, and includes a driver 16 inside. The IC chip 12 is connected to the transmission channel 14 via a branching transmission channel 15, and includes a receiver 17 formed by a differential amplifier inside. Similarly, the IC chip 13 is connected to the transmission channel 14 via a branching transmission channel 16, and includes a receiver 18 formed by a differential amplifier inside. A terminal circuit formed by a terminal resistance $R_T$ is connected to the other end of the transmission, channel 14. The terminal resistance $R_T$ connects both ends of the transmission channel 14, that is, the ends of both wires constituting pair wires forming the transmission channel 14.

The driver 16 of the IC chip 11 transmits a signal by driving the transmission channel 14. The receivers 17 and 18 of the IC chips 12 and 13, respectively, receive the signal on the transmission channel 14.

The driver 16 is connected to the ends of both of the pair wires of the transmission channel 14. The driver 16, the transmission channel 14 and the terminal resistance $R_T$ form a loop. The driver 16 is a current switch type, and includes the function of always applying a constant current to a voltage regulating resistance $R_{E1}$. The driver 16 includes two n-channel MOS (nMOS) transistors 19 and 20, varactors 21 and 22, and two resistances $R_E1$ and $R_E2$. The transistors 19 and 20 constitute differential amplifiers. The varactors 21 and 22 are capacitive elements changing the capacity in response to input signals Vin and /Vin, respectively. The varactors 21 and 22 give/receive charge (electric charge) to/from the above-described differential amplifiers so as to make the switching operation of the differential amplifiers fast.

As described above, the driver 16, the transmission channel 14 and the terminal resistance $R_T$ form the loop. In the loop, including the branching transmission channels 15 and 16, the transmission channel 14 is not connected to the common ground at any place, and functions as an independent ground line. Hence, the ground level swings complementarily to the other signal level. Accordingly, it is possible to give the effective peak magnitude voltage to the receivers 17 and 18 of the differential amplifiers.

The gates of the transistors 19 and 20 receive the input signals /Vin and Vin, respectively, supplied from an internal circuit (not shown) of the IC chip 11. The input signals /Vin and Vin are complementary signals. The drains of the transistors 19 and 20 are connected to a power supply voltage Vdd on the high potential side via the resistance $R_E1$. The resistance $R_E1$ is a resistance for current control that determines a constant current value when seen from the power source Vdd. The source of the transistor 20 is connected to one of the two wires forming the transmission channel 14. The source of the transistor 19 is connected to the other wire of the transmission channel 14 via the resistance $R_E2$. The resistance $R_E2$ functions as a terminal resistance. The varactors 21 and 22 are formed by transistors. The drain and source of the varactor 21 are connected to one end of the resistance $R_E1$, and the gate receives the input signal Vin. The drain and source of the varactor 22 are connected to the same one end of the resistance $R_E1$, and the gate receives the input signal /Vin. One end of the resistance $R_E2$ is connected to a power supply voltage Vss (for example, ground) on the low potential side.

In the following, a description will be given of the characteristics of this embodiment.

First, the current switch type driver 16 formed by the transistors 19 and 20 is used. Second, the varactors 21 and 22 are used. Third, a signal wire transmitting the input signals Vin and /Vin of the driver 16 supplied from an internal circuit of the IC chip 11 has a transmission channel structure. Relating to the third characteristic, preferably, a signal wire such as a power source wire (power source paired ground line) relating to the driver 16 has a transmission channel structure.

The above-described first characteristic is mainly intended to reduce the voltage drop on the transmission channel 14, which voltage drop occurs when the input signals Vin and /Vin vary. The second characteristic mainly intends to reduce or substantially eliminate the influence of the pn junction capacity of the transistors 19 and 20. The third characteristic mainly intends to reduce or substantially eliminate the parasitic capacitance of the transistors 19 and 20. The present invention includes an electronic circuit omitting the first and second characteristics, that is, an electronic circuit having the third characteristic only. Even in this structure, it is possible to transmit a digital signal in the GHz band with small distortion of the waveform. Preferably, the electronic circuit includes the first through third characteristics. It is possible to transmit the digital signal in the GHz band with less distortion of the waveform when the third characteristic is combined with the first and second characteristics.

In the following, a description will be given of the first through third characteristics in order.

To begin with, as mentioned above, the first characteristic is that the current switch type driver 16 formed by the transistors 19 and 20 that are shown in FIG. 2 is used. The reason for using the driver is as follows.

The driver 16 transmits the digital signal that is a pulsed output signal to the transmission channel 14. In order to perform such signal output, a switch and a power source are required. When a high current starts to flow instantaneously in a state where no current is flowing, the current transition gradient di/dt becomes steep, and the voltage drop v=Ls (di/dt) is produced. It should be noted that Ls represents the parasitic inductance in the circuit. When the voltage drop is produced, the power source Vdd drops instantaneously by the amount of v to (Vdd−v). In order to avoid this, the parasitic inductance Ls in the circuit must be zero. However, in reality, it is almost impossible to make the parasitic inductance Ls zero. The rise time $t_r$ of a signal in signal transmission in the GHz band is equal to or less than 75 ps, and the parasitic inductance Ls is a problem.

In order to solve the problem, the current switch type driver 16 including a differential circuit that supplies a current to the transmission channel according to the signal is formed. Preferably, the driver 16 is formed by the smallest possible number of transistors (two transistors in FIG. 2).

Figure 3:
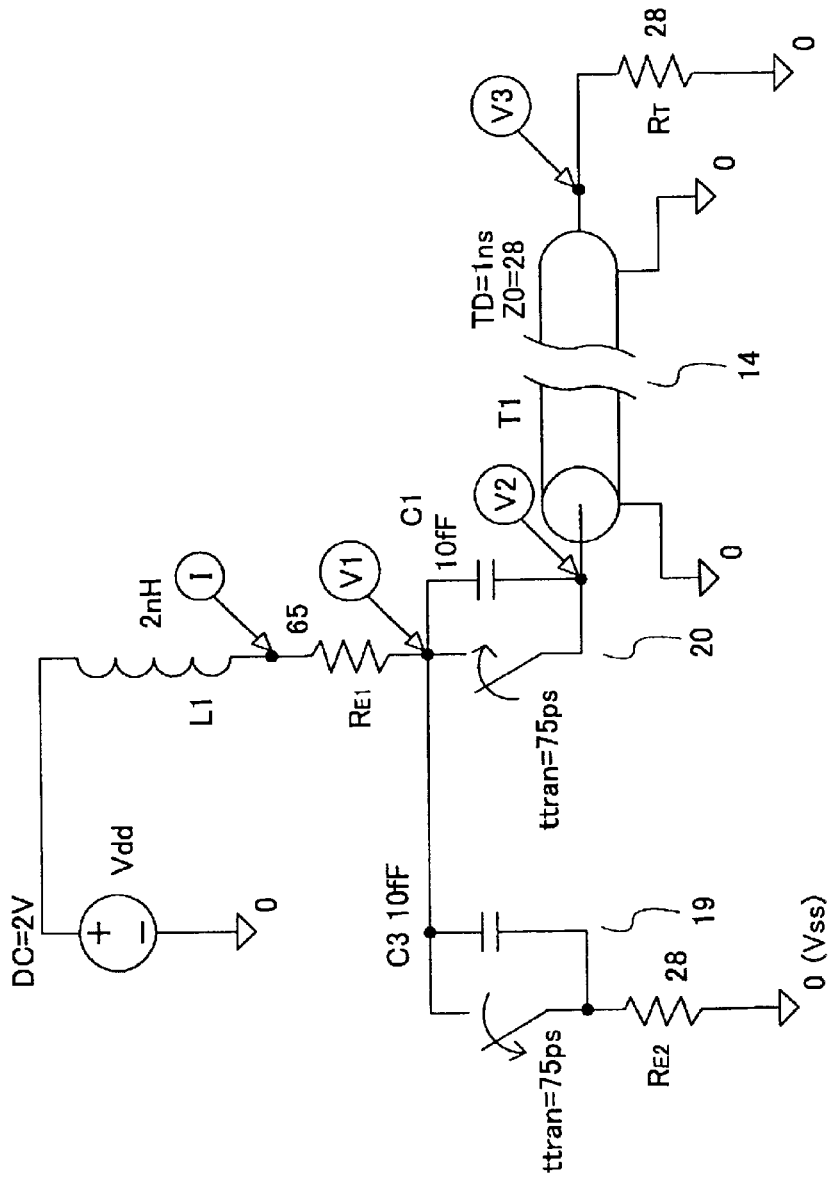
FIG. 3 is a circuit diagram showing a simulation model circuit having a circuit configuration in which the varactors 21 and 22 are eliminated from the driver 16 of FIG. 2.

FIG. 3 shows a simulation model circuit having the circuit structure in which the varactors 21 and 22 are removed from the driver 16 of FIG. 2. In FIG. 3, L1 is the parasitic inductance and is set to 2 nH. The DC power source Vdd is set to 2 V. The transistor 19 is shown by a switch and a parasitic capacitance C3 due mainly to the pn junction capacity. The rise time (state transition time) ttran of the input signals Vin and /Vin is set to 75 ps, and the parasitic capacitance C3 is set to 10 fF. The transistor 20 is shown by a switch and a parasitic capacitance C1 due mainly to the pn junction capacity. The parasitic capacitance C1 of the transistor 20 is set to 10 fF. The ON/OFF time of the transistors 19 and 20 is set to 1 ns.

The transmission channel 14 has the length of 150 mm. The delay time TD corresponding to the length is set to 1 ns. In addition, the characteristic impedance of the transmission channel 14 is set to 28 Ω. Further, the voltage of the transmission channel 14 is set to 0.6 V. In FIG. 3, numeric values without units represent the values of resistances. The resistance $R_E1$ for the current control is shown as 65 Ω, which is the total value when the original value of the resistance $R_E1$ is 50 Ω, and the ON-resistance of the transistors 19 and 20 is 15 Ω. The resistance $R_{E2}$ and the terminal resistance $R_T$ are set to 28 Ω.

Figure 4:
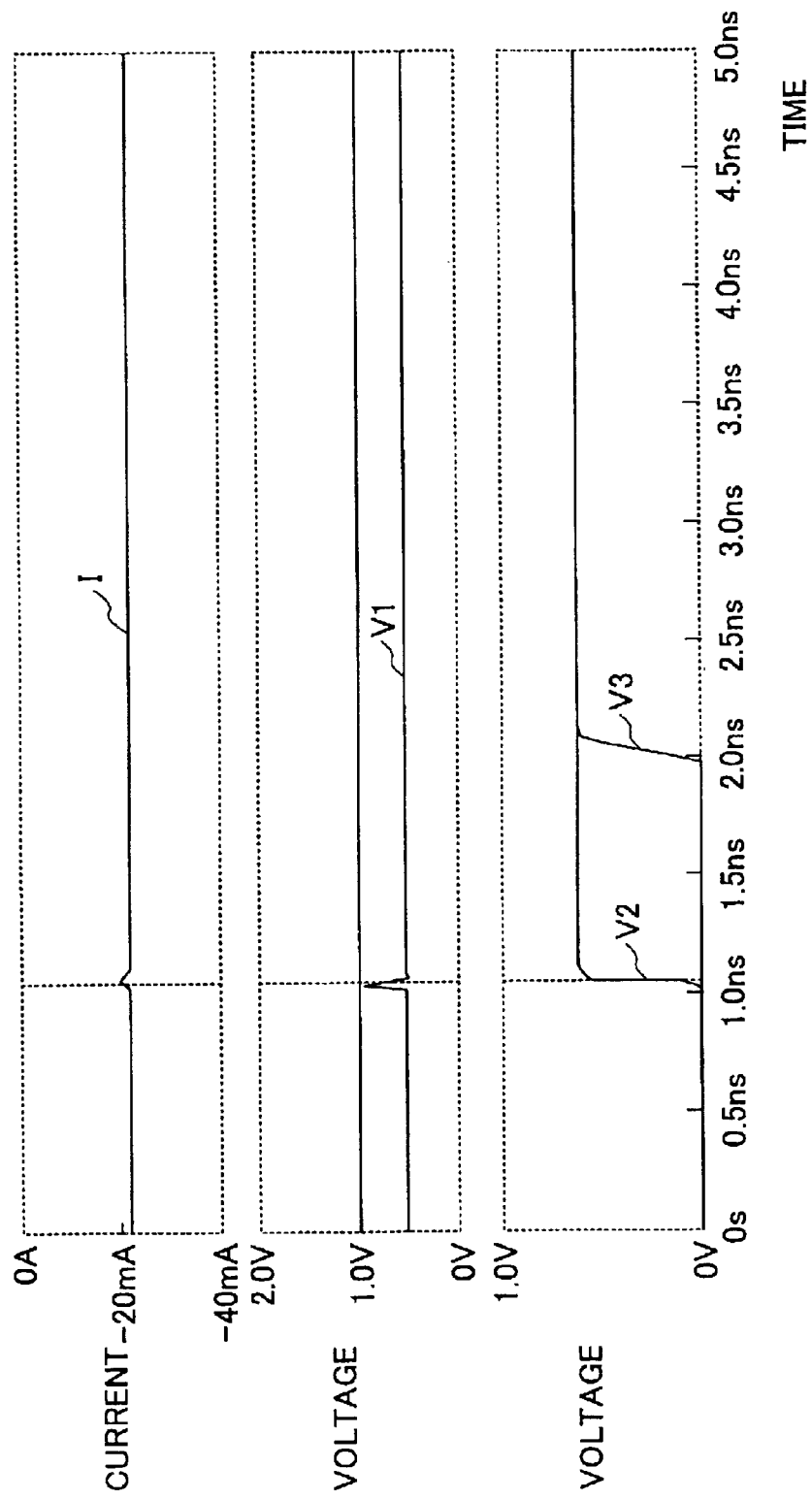
FIG. 4 is a schematic diagram showing a simulation result of the simulation model circuit of FIG. 3.

FIG. 4 shows a simulation result of the simulation model circuit shown in FIG. 3. In FIG. 4, the horizontal axis represents time, and the vertical axis represents voltage. A current I is the current flowing from the power source Vdd. Voltages V1, V2 and V3 are the respective voltages of the nodes shown in FIG. 3. As shown in FIG. 4, in response to the rise of a several GHz input signal, the current I and the power supply voltage V1 vary slightly. However, the voltage V2 of the input terminal of the transmission channel 14 is increased quickly (rapid rate). Additionally, the voltage V3 of the output terminal of the transmission channel 14 is increased quickly (rapid rate) 1.0 ns after the rise of the voltage V2.

The varactors 21 and 22 shown in FIG. 2 have the function of controlling the variation of the current I and the power-supply voltage V1 shown in FIG. 4. The current I and the power supply voltage V1 vary under the influence of the pn junction at the moment when the input signals of the transistors 19 and 20 vary. In the following, a description will be given of the second characteristic using the varactors 21 and 22.

As shown in FIG. 2, each of the varactors 21 and 22 is formed by an n-channel MOS transistor. The inversion signals Vin and /Vin are supplied to the varactors 21 and 22, respectively. The electric charge necessary for charging the pn junction capacity of the transistors 19 and 20 is discharged from the varactors 21 and 22 in synchronization with the input signals Vin and /Vin. Therefore, the load of the power source Vdd is substantially eliminated. In other words, the varactors 21 and 22 have the pn junction capacity corresponding to the pn junction capacity of the transistors 19 and 20. That is, when the charge is released from the transistors 19 and 20, the varactors 21 and 22 require the charge. The released charge is accumulated in the pn junction capacity of the varactors 21 and 22.

Figure 5:
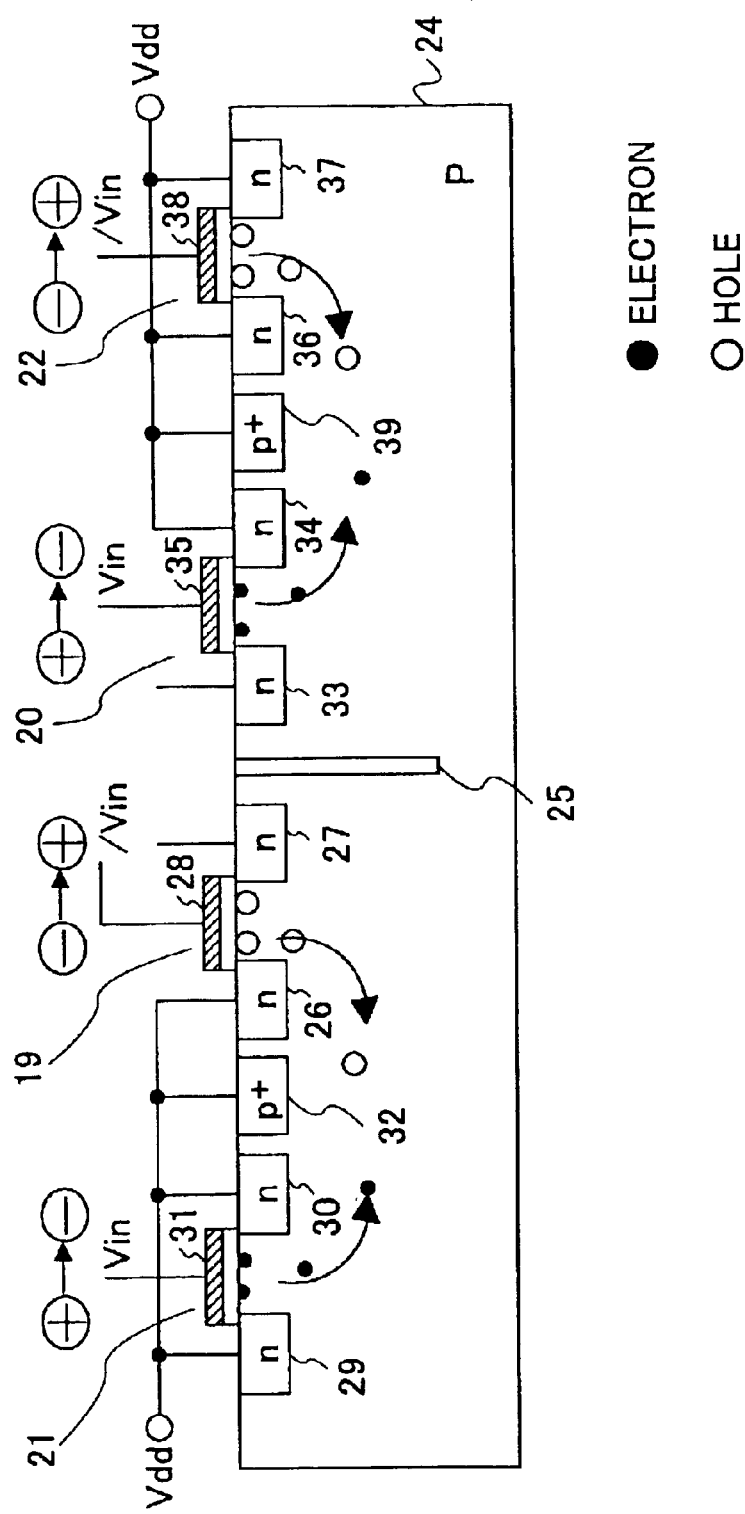
FIG. 5 is a cross-sectional view of the driver 16 of FIG. 2.

FIG. 5 is a cross-sectional view of the driver 16 shown in FIG. 2, and is showing the function of the varactors 21 and 22. The circuit of the IC chip 11 including the driver 16 is formed on a p-channel semiconductor substrate 24. A trench isolation 25 is formed on the semiconductor substrate 24, the transistor 19 and the varactor 21 are formed on the left side of FIG. 5, and the transistor 20 and the varactor 22 are formed on the right side of the FIG. 5. The transistor 19 includes a gate 28 provided on an insulating layer formed on n-channel diffusion areas 26 and 27 and the semiconductor substrate 24. The varactor 21 includes a gate 31 provided on an insulating layer formed on n-channel diffusion areas 29 and 30 and the semiconductor substrate 24. The transistor 19 and the varactor 21 are electrically insulated by a p+ diffusion area 32. The transistor 20 includes a gate 35 provided on an insulating layer formed on n-channel diffusion areas 33 and 34 and the semiconductor substrate 24. The varactor 22 includes a gate 38 provided on an insulating layer formed on n-channel diffusion areas 36 and 37 and the semiconductor substrate 24. The transistor 20 and the varactor 22 are electrically insulated by a p+ diffusion area 39.

The diffusion areas 26, 29, 30 and 32 are connected to the power source Vdd. Similarly, the diffusion areas 34, 36, 37 and 39 are connected to the power source Vdd. The diffusion area 27 is connected to the resistance $R_{E2}$ shown in FIG. 2, and the diffusion area 33 is connected to the transmission channel 14 shown in FIG. 2.

FIG. 5 shows a condition where the input signal Vin is changed from plus to minus, and the input signal /Vin that is the inversion (complementary) signal is changed from minus to plus. When the transition of the input signals Vin and /Vin occurs, holes, which become useless under the gate (channel) of each transistor or in the vicinity, combine with electrons. For example, holes of the channel of the transistor 19 combine with electrons of the channel of the varactor 21. When the input signals Vin and /Vin vary inversely, the electrons and the holes are inversely related with respect to the relationship shown in FIG. 5. Since the varactors 21 and 22 can vary their capacities, and thus actively perform pumping-up/pumping-down operations of holes and electrons. Accordingly, the power source Vdd and the ground Vss are free from influence of the change in the input signals Vin and /Vin.

From the above-described operation, it can be said that the pn junction capacity of the transistors 19 and 20 is substantially eliminated.

Figure 6:
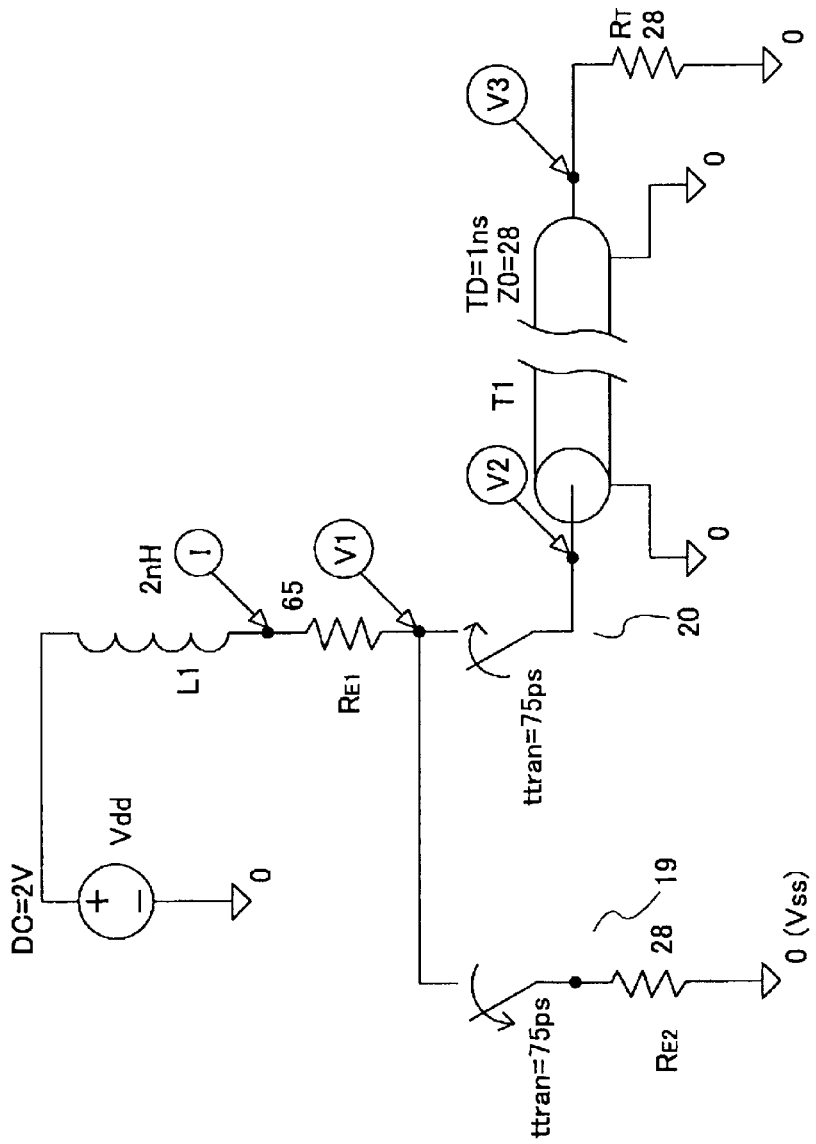
FIG. 6 is a circuit diagram showing a simulation model circuit of the driver 16 of FIG. 2.

FIG. 6 shows a simulation model circuit of the driver 16 shown in FIG. 2. The difference between the simulation model circuit shown in FIG. 6 and the simulation model circuit shown in FIG. 3 is that the parasitic capacitances C3 and C1 of the transistors 19 and 20, respectively, are eliminated under the action of the varactors 21 and 22.

Figure 7:
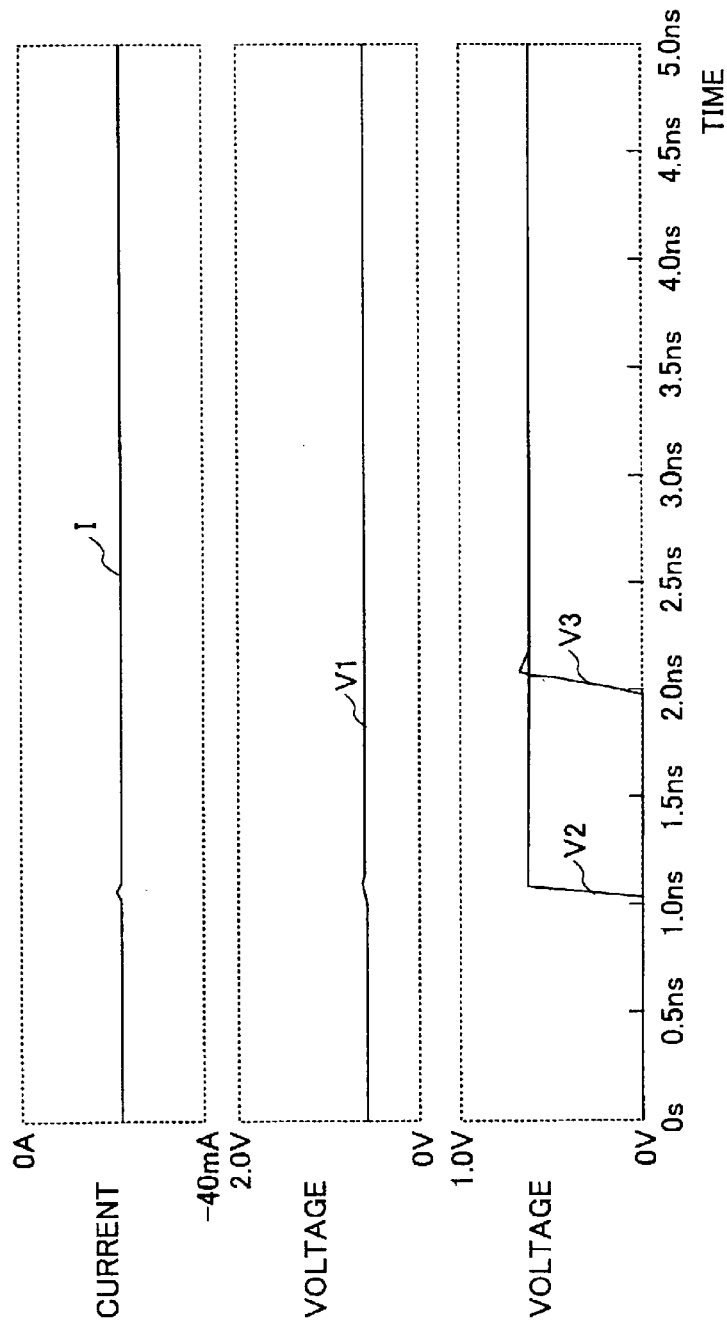
FIG. 7 is a schematic diagram showing a simulation result of the simulation model circuit of FIG. 6.

FIG. 7 shows a simulation result of the simulation model circuit shown in FIG. 6. Comparing with FIG. 4, the current I and the power supply voltage V1 shown in FIG. 7 have little distortion of the waveforms and are very stable. Additionally, the voltage V3 has an almost ideal waveform. Thus, it is recognized that the driver 16 having the circuit configuration shown in FIG. 2 possesses the performance such as to act as a high-speed driver.

As mentioned above, according to the first and second characteristics, the current I is kept constant, and the problems caused by the parasitic inductance and the pn junction capacity are almost eliminated. However, the existence of parasitic capacitance that is parasitic on wiring connected to the driver is not considered. Even a small parasitic capacitance of only 10 fF has much effect on the signal transmission in the GHz band. The above-described third characteristic pays attention to this problem. According to the third characteristic, the signal wire that transmits the input signals Vin and /Vin has the transmission channel structure. Preferably, the signal wire relating to the driver 16, such as a power source wire (power source paired ground line), has the transmission channel structure.

The transmission line possesses line inductance $L_0$ and capacitance $C_0$. However, under the condition that the electromagnetic field does not leak to the outside, $L_0$ and $C_0$ exist simultaneously on the wiring. Thus, impedance Z is not obtained by $Z=j\omega L_0+(j\omega C)^{-1}$, but by the root mean square:

$$\sqrt{j\omega L_0/j\omega C_0}=\sqrt{L_0/C_0}=Z.[\Omega]$$

The impedance of the wiring is resistance of an actual number since jω is eliminated. That is, the capacitance and inductance substantially do not exist. A clear example of this is a co-axial cable. For wiring, there are a stripline (including a microstripline and so on), a coplanar line, a stacked pair line and so on. Such transmission channel structures can handle tens of GHz, and the parasitic inductance and parasitic capacitance can be made negligibly small.

A description will be given of the third characteristic of the driver 16, with reference to FIG. 1 that is briefly explained already.

FIG. 1 shows the layouts of the transistors 19 and 20 and the layouts of the varactors 21 and 22. The transistor 19 and the varactor 22 are adjacent in the lateral direction of FIG. 1. In the longitudinal direction of FIG. 1, the varactor 21 and the transistor 19 are adjacent, and the transistor 20 and the varactor 22 are adjacent.

In the lateral direction, signal wires 70 and 71 each having the transmission channel structure are provided. The signal wires 70 and 71 are wiring having a coplanar line structure, and transmit the input signals Vin and /Vin ("/" represents an inversion signal), respectively. The signal wires 70 and 71 are adjacent in the same layer level and separated by a predetermined distance. The signal wire 70 extends close to the gates of the transistor 20 and the varactor 21. The signal wire 70 extends close to a gate 45 of the transistor 20, and is connected to the gate 45. In addition, the signal wire 70 passes near a gate 57 of the varactor 21, and is connected to the gate 57. Similarly, the signal wire 71 extends close to the gates of the transistor 19 and the varactor 22. The signal wire 71 passes near a gate 54 of the transistor 19, and is connected to the gate 54. In addition, the signal wire 71 extends close to a gate 62 of the varactor 22, and is connected to the gate 62.

The coplanar line structure is also applied to other wires relating to the transistors 19 and 20 and the varactors 21 and 22. For example, a power source wire (power source paired ground line) 55 of Vdd and a power source wire (power source paired ground line) 56 of Vss have the coplanar line structure, and pass over the transistor 19 and the varactor 21. Power source wires (power source paired ground lines) 43, 44, 55 and 56 are located in a layer level that is higher than a wiring level in which the signal wires 70 and 71 are provided. Additionally, though not shown, it is preferable that a clock line transmitting a clock have the transmission channel structure.

FIG. 1B is the cross-sectional view showing the layer structure near the transistor 20. In order to show the layer structure simply, FIG. 1B shows a cross section of FIG. 1A taken along not a simple plane but a curved surface.

Diffusion areas 40 and 41 are formed in the above-described semiconductor substrate 24. An insulating layer 65 is formed on the semiconductor substrate 24. In the insulating layer 65, the gate 45 and plugs 67 and 68 are formed. For the sake of convenience, the insulating layer 65 is integrally shown. However, actually, the insulating layer 65 includes several insulating layers: a gate oxide, an insulating layer provided on the gate oxide, for example. An insulating layer 66 is formed on the insulating layer 65. For the sake of convenience, the insulating layer 66 is also integrally shown. However, actually, the insulating layer 66 includes a plurality of insulating layers. The plug 67 and a resistance layer 42 are electrically connected through a via 47 provided in the insulating layer 66. The resistance layer 42 constitutes the resistance $R_E1$ of FIG. 2. It is preferable that the resistance layer 42 be not a diffused resistor bringing about a pn junction capacity, but be a metal film resistor such as molybdenum and tungsten.

The resistance layer 42 is connected to the power source wire 43 of Vdd through a via 48. Both power source wires 43 and 44 have the coplanar line structure. In addition, power source wires (power source paired ground lines) 73 and 74 (not shown in FIG. 1A) having the coplanar line structure are provided next to the power source wires 43 and 44. A power source wire (power source paired ground line) 75 (the other power source wire is behind the back of the power source wire 75) having the coplanar line structure is provided on the insulating layer 66.

The diffusion area 41 is connected to a contact wiring 69 through the plug 68. The contact wiring 69 is connected to one wiring of the transmission channel 14 as shown in FIG. 1B. The transmission channel 14 is provided in the same layer level as the resistance layer 42.

The gate 45 is connected to the signal wire 70, however, the condition is not shown in FIG. 1B. The signal wires 70 and 71 are in a layer level that is higher than the gate 45, that is, in the layer level where the transmission channel 14, the resistance layer 42 and the like are formed. The gate 45 and the signal wire 70 are electrically connected through a via (not shown in FIGS. 1A and 1B) provided in the insulating layer 65.

As mentioned above, since the wiring inside the IC chip 11 has the transmission channel structure, it is possible to minimize the parasitic inductance and parasitic capacitance so as to be negligibly small. Hence, it possible to transmit a signal in tens of GHz finely.

In the following, a description will be given of parts that are not explained, among the parts shown in FIG. 1A. The other line of the transmission channel 14 is connected to the power source wire 44 of Vss via a contact 46. At the same time, the other line of the transmission channel 14 is connected to the power source wire 56 of Vss through a transmission channel 49 and a contact (via) 53. The two diffusion areas of the transistor 19 are connected to the power source wires 55 (Vdd) and 56 (Vss) through resistance layers 50 and 52, respectively. The resistance layer 50 constitutes the above-described resistance $R_{E1}$ for the current control. The resistance layer 52 constitutes the resistance $R_{E2}$ corresponding to the above-described terminal resistance. The resistance layer 50 is connected to the power source wire 55 of Vdd through a via 51, and the resistance layer 52 is connected to the power source wire 56 of Vss through the via 53.

The varactor 21 includes a wiring 58 contacting two diffusion areas. The wiring 58 contacts a power source wire (power source paired ground line) 59 of Vdd. The varactor 22 includes a wiring 63 contacting two diffusion areas. The wiring 63 contacts the power source wire 43 of Vdd.

Further, in the above-described structure, the wires 58 and 63, the resistance layers 42, 50 and 52, and the transmission channel 49 do not have the coplanar transmission line structure. However, since the lengths thereof are very short, the amounts of the parasitic capacitance and parasitic inductance are negligible.

Referring to FIG. 1B, a description will be given of distance relationship between wiring layers.

First, a description will be given of the relationship between a height t of the power source wires 43 and 44, and a distance d between their opposing surfaces. Impedance $Z_0$ of the transmission channel can be calculated as the following formula (1), $$Z_0 = \sqrt{L_0/C_0} = \sqrt{\mu\mu_o(d/t)/\varepsilon_r\varepsilon_o(t/d)} \quad \text{Equation (1)}$$
$$= (d/t)\sqrt{\mu\varpi_o/\varepsilon_r\varepsilon_o}$$
$$= 376.7(d/t)\sqrt{\mu_r/\varepsilon_r} \; [\Omega]$$

It should be noted that $\mu_r$ is a relative magnetic permeability, $\mu_0$ is a magnetic permeability in a vacuum, $\varepsilon_r$ is a relative dielectric constant, and $\varepsilon_0$ is a dielectric constant in a vacuum.

By substituting the numerical values shown in the following Table 1 into equation (1), a fringe factor K ($K_C$: a fringe factor due to capacitance, $K_L$: a fringe factor due to inductance) is calculated as follows.

TABLE 1 fringe factor ($K_c$, $K_L$)

| t/d | K relative dielectric constant, relative magnetic permeability = 1 | K $\varepsilon_r = 4.5$ |
|---|---|---|
| 0.100 | 14.33 | 9.30 |
| 0.125 | 12.08 | 7.90 |
| 0.2 | 8.51 | 5.68 |
| 0.25 | 7.25 | 4.86 |
| 0.5 | 4.25 | 3.14 |
| 1.0 | 2.98 | 2.17 |
| 2.5 | 1.92 | 1.50 |
| 5.0 | 1.52 | 1.27 |
| 10 | 1.29 | 1.14 |

When using the fringe factor K in the stacked pair line, K may be substituted into equation (1) as follows.

$$C_0 = K_C\varepsilon_0\varepsilon_r w/d \; [F/m], \quad \text{Equation (2)}$$
$$L_0 = (1/K_L)\mu_0\mu_r d/w \; [H/m]$$
$$Z_0 = \sqrt{L_0/C_0} = (1/\sqrt{K_C K_L})(\sqrt{\mu_r/\varepsilon_r})(\sqrt{\mu_0/\varepsilon_0})(d/w)$$
$$= 377(1/\sqrt{K_C K_L})(\sqrt{\mu_r/\varepsilon_r})(d/w)$$

In the structure shown in the cross-sectional view of FIG. 1B, since the power source wires 43 and 44 have the same sizes, $K_C = K_L$ is satisfied.

According to equation (1), fringe-like spread of an electromagnetic field is not negligible when the adjacent opposing surfaces are far larger than the thickness. Thus, fringing effect becomes greater as the thickness ratio increases. The degree of the increase becomes a function of the distance d between the opposing surfaces. When the link between the pair wires is stronger, the fringing effect is small. When t/d=10, K=1.14 where $\varepsilon_r=4.5$, it is almost close to equation (1).

A case of $Z_0=50\;\Omega$ where $\varepsilon_r=4.5$ is considered. In equation (1), t/d=3.56 and the fringing effect is not negligible.

When calculated by equation (2), K=1.4 and t/d=2.5 are obtained. When $Z_0=75\Omega$, t/d=2.37 is obtained from equation (1), and K=2 and t/d=1.2 are obtained from equation (2). K=2 is a condition for obtaining opposing surface electromagnetic field energy that is the same as fringe electromagnetic field energy, and indicates that the electromagnetic field relating to crosstalk spreads widely. In order to avoid the crosstalk, generally, the strength of coupling, that is, characteristic impedance, is set equal to or less than 50 Ω. T/d is the ratio of the thickness L of the wires to the distance d between the wires on a chip. Accordingly, it is preferable that the aspect ratio be equal to or more than 1.5 (t/d≧1.5) where the characteristic impedance is a little greater than 50 Ω.

Figure 8:
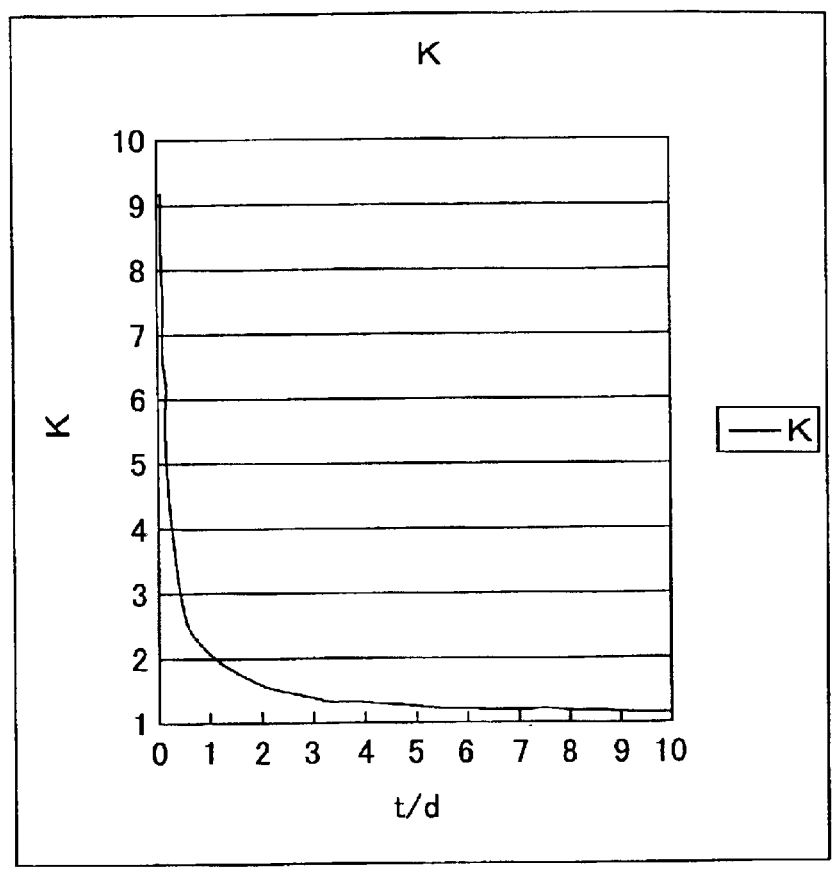
FIG. 8 is a graph showing the relationship between a ratio of the thickness of a line to the distance between lines and a fringe factor K.

FIG. 8 shows the relationship between the value of t/d and the fringe factor K. When t/d≧1.5 is satisfied, the value of the fringe factor K falls below 2.

As described above, by increasing the opposing area by setting the respective aspect ratios of the power source wires 43 and 44, it is possible to strengthen the coupling between Vdd and Vss and to reduce the leakage of the electromagnetic field toward the outside. Further, it should be noted that the above-described rule between the power source wires 43 and 44 may be applied not only to another pair of power source wires but also to the relationship between the signal wires 70 and 71.

Second, it is preferable that a condition d<h be satisfied where h represents the distance between the resistance layer 42 and the power source wire 43. The condition is for preventing the fringe of the opposing surface electromagnetic field from crossing across the layers as much as possible, that is, for avoiding crosstalk.

Third, it is preferable that s/d be equal to or more than 1.5 (s/d≧1.5) where s represents the distance between adjacent sets of wires. This condition (relationship) is also for preventing the influence of the fringe as much as possible.

It is preferable that each of the above-described conditions be satisfied in all other wires. It is preferable that not only drivers, but also receivers (that will be described later), the logic of LSI operating by a clock frequency in tens of GHz, wire connections of memory transistors and the like have transmission channel structures. In addition, it is preferable that each of the above-described conditions be satisfied in all wires in each of the IC chips of the system.

By constructing as mentioned above, it is possible to achieve the current switch type driver circuit 16 that has little fluctuation of a current and is almost ideal.

Here, electric power consumption is considered. As shown in FIGS. 4 and 7, the constant current I is approximately 21 mA, and is constantly flowing from the power source Vdd. When the voltage is 0.6 V, electric power as large as 13 mW is consumed. A 64-bit address data line requires lines for 200 or more bits including control signals, and consumes huge electric power of 2.6 W in total. When the resistance $R_{E1}$ is increased and voltage has an amplitude of 0.3 V, the electric power consumption is 1.3 W where I=10.5 mA. However, as described above, since a signal almost ideal and almost perfect passes through the driver 16, the amplitude equal to or less than 0.3 V is a sufficient signal source.

Next, a description will be given of branches.

The electronic device 10 of FIG. 2 includes two branches for convenience. In other words, the IC chips 12 and 13 are connected to the transmission channel 14 through the branching transmission channels 15 and 16, respectively. In practice, more IC chips are connected in many cases.

Figure 9:
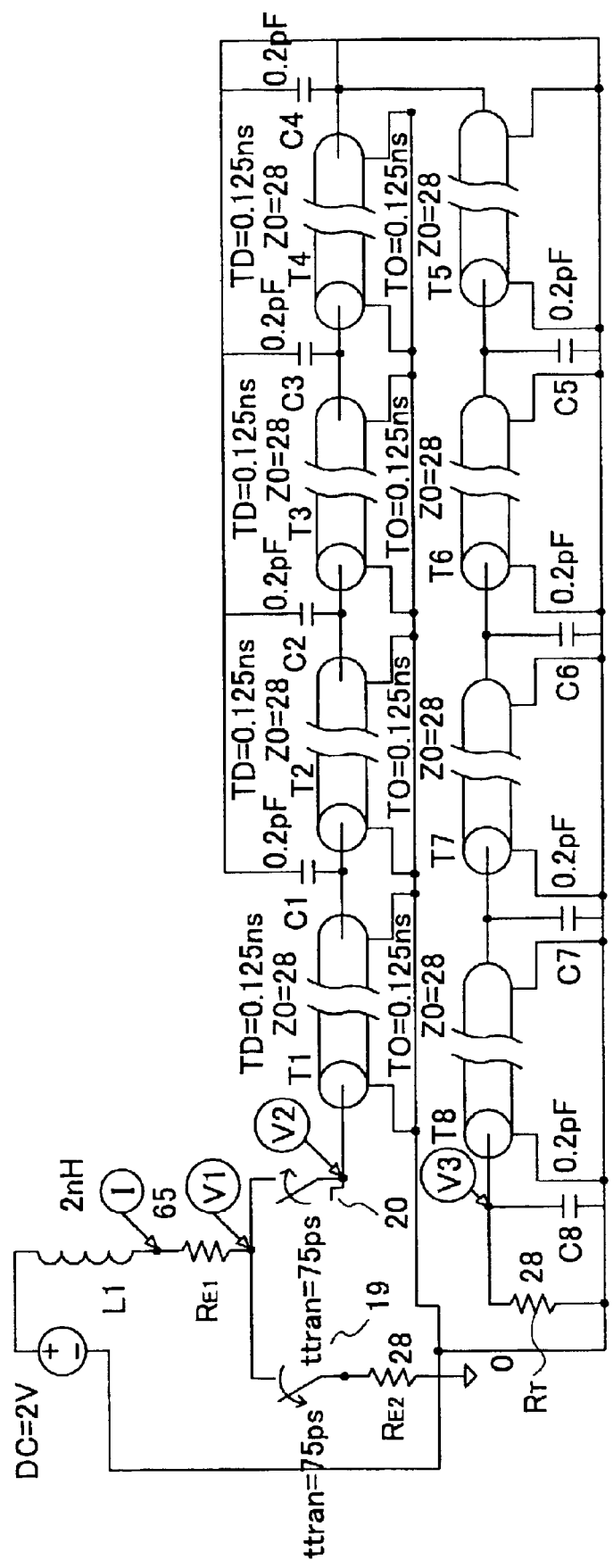
FIG. 9 is a circuit diagram showing a simulation model circuit when the electronic device of FIG. 2 is constituted by eight branches.

FIG. 9 shows a simulation model circuit in a case where the electronic device 10 of FIG. 2 includes eight branches. Receivers in eight IC chips are constituted by differential amplifiers. It is assumed that one branch has a capacity of 0.2 pF, since signals of the receiver are received by the gates of the transistors constituting the differential amplifiers. The capacity is a high capacity that is more than sufficient, since the driver 16 having the above-described first through third characteristics has little wiring capacity. That is, the eight branches each having 0.2 pF capacity correspond to sixteen branches having 0.1 pF or 32 branches having 0.05 pF, and these capacity values are realistic values that can be designed.

Figure 10:
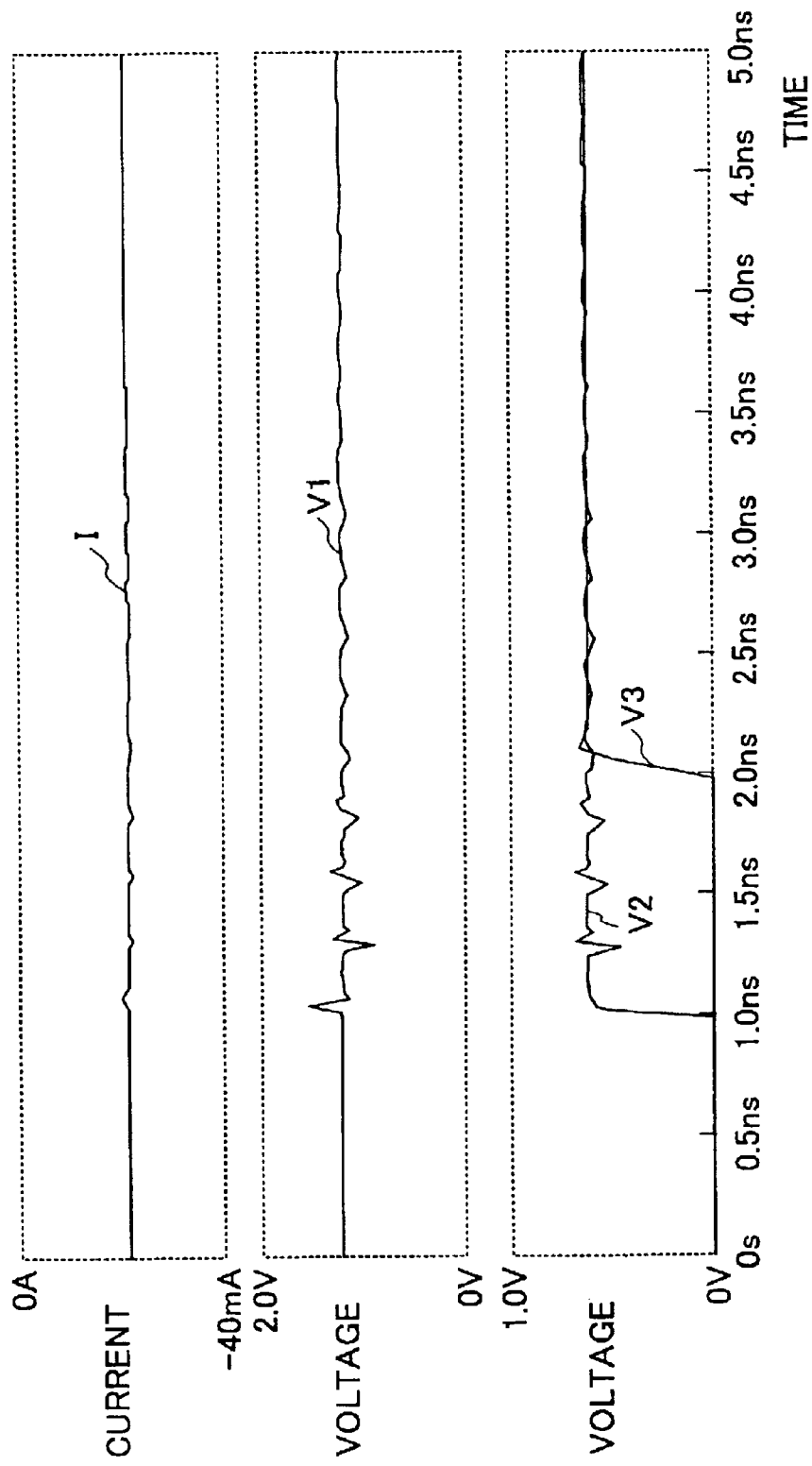
FIG. 10 is a schematic diagram showing a simulation result of the simulation model circuit of FIG. 9.

FIG. 10 shows a simulation result of FIG. 9. The horizontal axis and vertical axis of FIG. 10 are the same as those of FIGS. 4 and 7. There are fluctuations in the current I and the voltages V1, V2 and V3. However, practically, the fluctuations are at levels almost insignificant. Though not shown, it is confirmed that more flat and better waveforms are obtained with sixteen branches having 0.1 pF and 32 branches having 0.05 pF.

According to the above-described simulation, when the load is controlled within 2 pF in total, the driver 16 can effectively perform signal transmission in the GHz band.

Next, a description will be given of the receivers 17 and 18 of the IC chips 12 and 13 of FIG. 2, respectively, by referring to FIG. 11.

Figure 11:
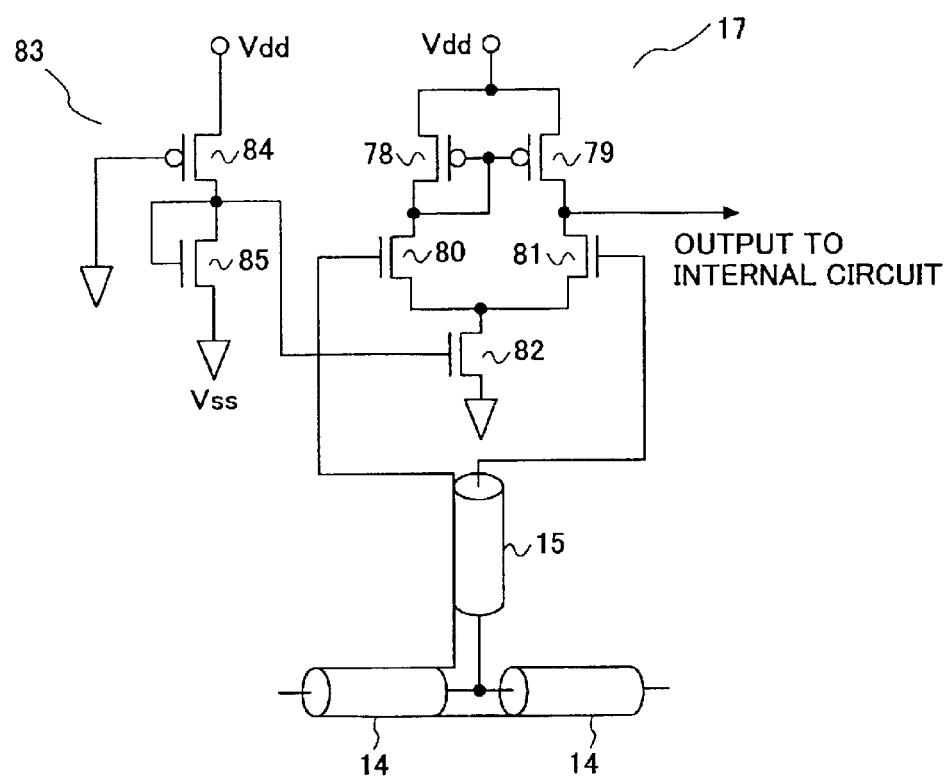
FIG. 11 is a circuit diagram showing the receiver 17 of the IC chip 12 shown in FIG. 2 and a peripheral circuit.

FIG. 11 is a circuit diagram showing the receiver 17 of the IC chip 12 and the peripheral circuit. The receiver 17 includes two pMOS transistors 78 and 79, and three nMOS transistors 80, 81 and 82. The sources of the transistors 78 and 79 are connected to the power source Vdd, and the drains of the transistors 78 and 79 are connected to the drains of the transistors 80 and 81, respectively. The gates of the transistors 78 and 79 are connected each other and are also connected to the drain of the transistor 80. The gates of the transistors 80 and 81 are connected to the branching transmission channel 15. The drain of the transistor 82 is connected to the sources of the transistors 80 and 81. The source of the transistor 82 is connected to the power source Vss. The gate of the transistor 82 is connected to the output of a current setting part 83 that is constituted by a pMOS transistor 84 and a nMOS transistor 85. The source of the transistor 84 is connected to the power source Vdd. The gate of the transistor 84 is connected to the power source Vss. The drain of the transistor 84 is connected to the drain of the transistor 85 and the gate of the transistor 82. The source of the transistor 85 is connected to the power source Vss. The drain of the transistor 81 is connected to an internal circuit (not shown) of the IC chip 12.

A signal that is input from the transmission channel 14 through the branching transmission channel 15 enters the gates of the transistors 80 and 81. One of the transistors 80 and 81 is turned ON and the other is turned OFF according to the potential difference between the transistors 80 and 81. Thus, a current flows to either the circuit including the transistors 78 and 80 or the circuit including the transistors 79 and 81. This current is a constant current when seen from the power source Vdd. The transistor 82 controls the current.

As described above, the transmission channel 14 is not connected to the common ground at all. Thus, on the transmission channel 14, the ground level swings complementarily with a signal. The branching transmission channels 15 and 16 are not connected to the common ground, either. Accordingly, it is possible to achieve sufficient potential difference between the gates of the transistors 80 and 81. In this case, as seen in the simulation of FIGS. 9 and 10, the distortion of the waveforms does not for practical purposes cause a problem. Accordingly, the transmission and reception of the signal having very high reliability can be achieved.

Similar to the driver 16, it is preferable that the wires of the receiver 17 and the internal circuit have the transmission channel structures.

A description will be given of influence of the length of branch wiring on the whole system. It should be noted that the branch wiring refers to the total length of the branching transmission channel 15 shown in FIG. 11 and package wires (that will be described later). When the relative dielectric constant of the insulating layer in the IC chip 12 is 3, the transmission speed of an electromagnetic wave is $1.73 \times 10^8$ [m/s], and transmission delay is 0.578 ps in a case where the length of the branching transmission channel 15 is 100 μm. When pulse risetime of the transmission channel 14 is set to 75 ps, the delay introduced in a round-trip through the branching transmission channel 15 is 0.578×2= 1.156 ps, with which delay time it is possible to make 65 round-trips in 75 ps. During the delay time, the signal rises and assumes a stable state. Thus, though there is distortion of a waveform during the initial rise, after the initial rise, a signal having a stable waveform propagates through the branching transmission channel 15. In conclusion, it is possible to substantially neglect the existence of the branching transmission channel 15 having the length of 100 μm.

Further, wires (package wires) inside the IC chip 12 are considered. Each of the wires extends from a pad on a package to which the branching transmission channel 15 is connected to a pad inside the package. When a relative dielectric constant of an insulating material surrounding the package wires is 4.5, the transmission speed of electromagnetic waves of the package wires is $1.41 \times 10_8$ [m/s], and the delay per 1 mm-length wire is 7.1 ps. It is possible to make 5.3 round-trips in 75 ps. Generally, a design can be worked out with a condition equal to or better than (three times of reflection round trips)/(risetime), and 5.3 times is a quite practical value. Since the existence of the branching transmission channel 15 can be substantially neglected, it is preferable that the length of the branch wiring be determined mainly based on the total length of the package wires. Generally, by rounding the above-described 5.3 times, when a condition of (6×(total delay time by the total length of the branch wiring)<(risetime of a waveform) is satisfied, the influence of the branch wiring is substantially negligible. It should be noted that the condition is calculated based on the above-described specific values. However, practically, the condition is satisfied in various +practical embodiments. When the condition is described more generally, the branch wiring has a length satisfying a condition that the risetime of the waveform of the signal on the transmission channel 14 is greater than the delay time caused when making "n" (n=6 in the above-described example) round-trips of the branch wiring.

Next, a description will be given of a system structure of the electronic device 10.

As explained by referring to FIG. 2, the electronic device 10 is constituted by mounting the IC chips 11 through 13 and the transmission channel 14 on a wiring board 86 such as a printed wiring board.

Figure 12:
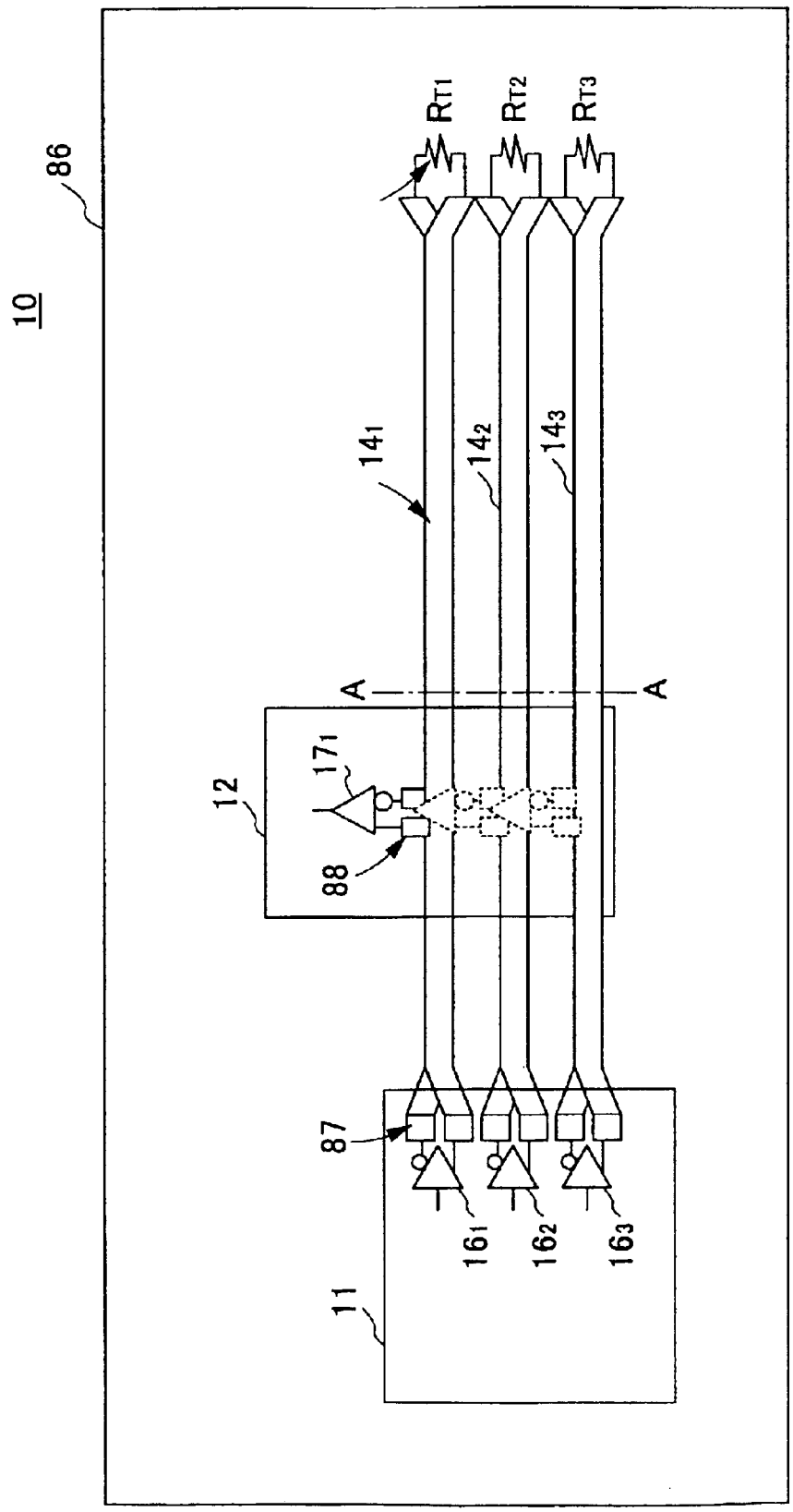
FIG. 12 is a model plan view of the electronic device of the present invention.
Figure 13:
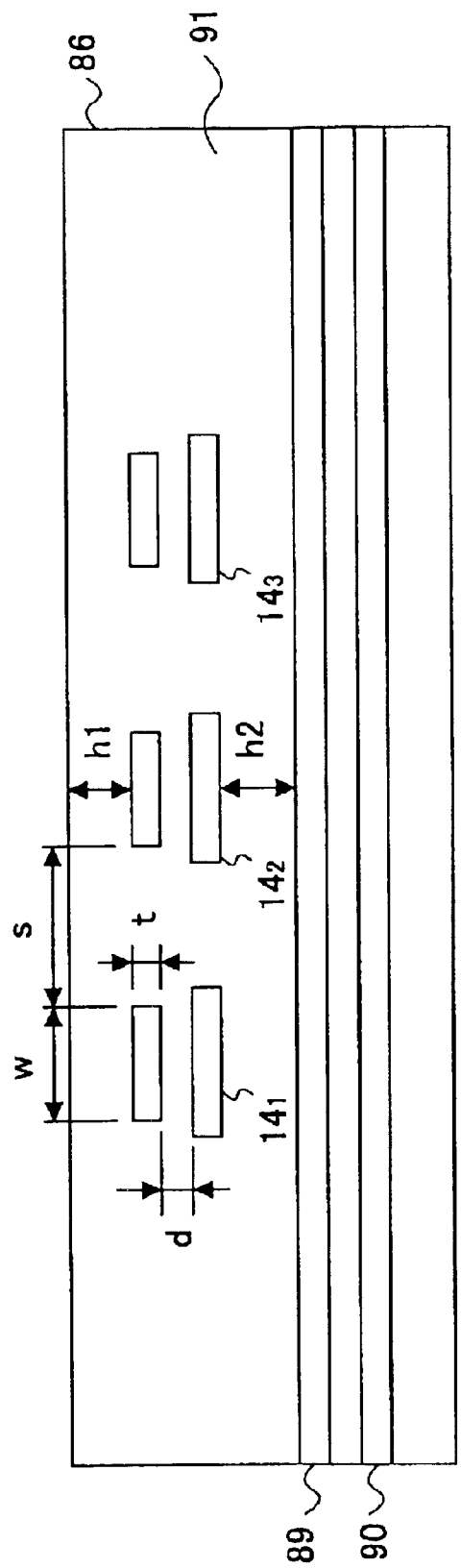
FIG. 13 is a cross-sectional view of the electronic device taken along a line A—A of FIG. 12.
Figure 14:
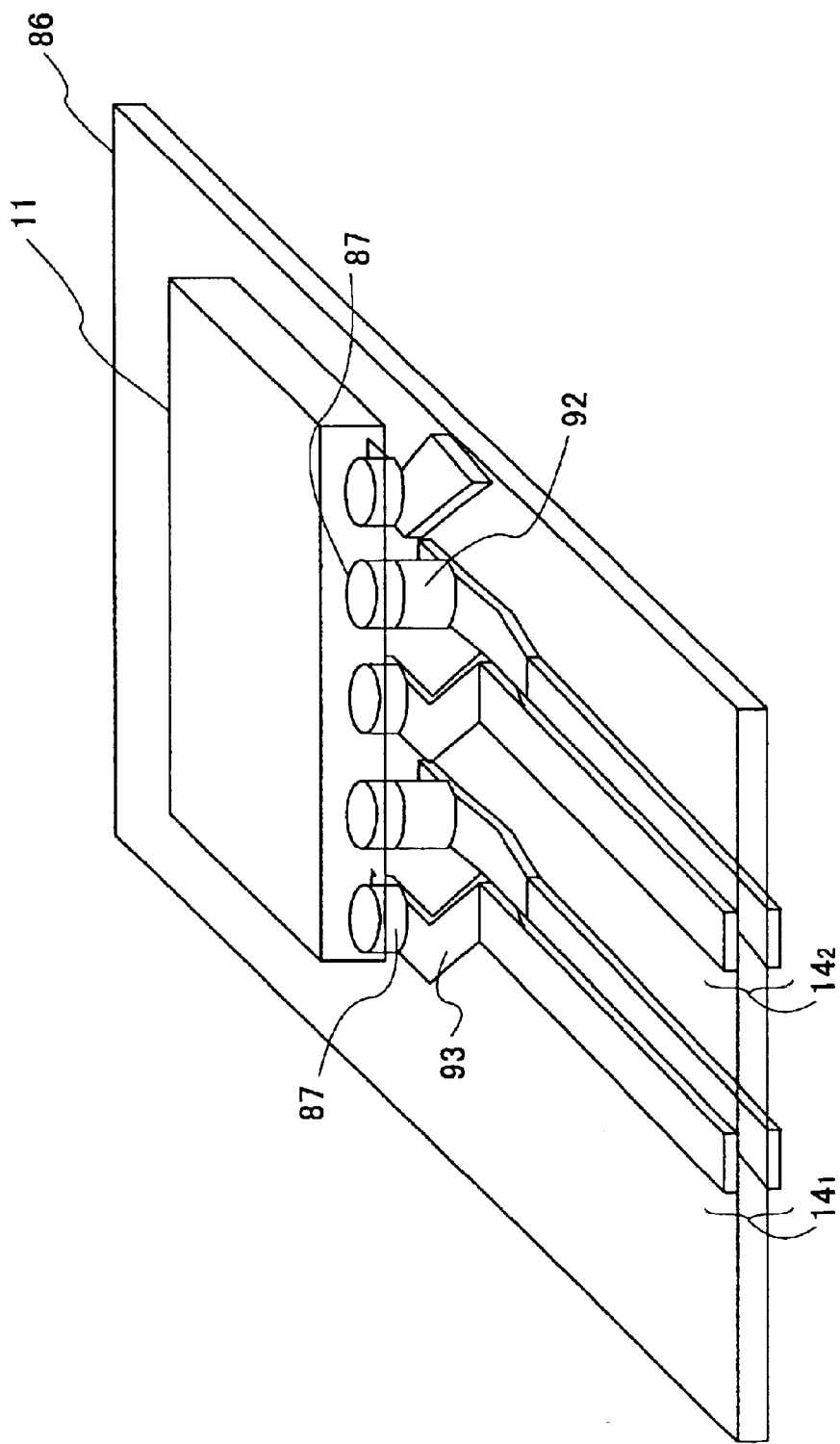
FIG. 14 is a perspective view of a packaged IC chip and a peripheral.

FIG. 12 is a model plan view of the electronic device 10, and FIG. 13 is a cross-sectional view taken along a line A—A of FIG. 12. In addition, FIG. 14 is a perspective view of a packaged IC chip 11 and the peripheral. In FIG. 12, the IC chip 13 shown in FIG. 2 is omitted.

The transmission channel 14 includes stacked pair lines $14_1$, $14_2$ and $14_3$, each having the equal length for a bit unit. As mentioned above, the preferable transmission channel structure in the IC chips 11 through 13 is the coplanar line structure. However, it is difficult to form, on a package or a wiring board, a structure having a cross sectional surface in which the aspect ratio is high and the longitudinal length is longer than the width. Accordingly, the transmission channel 14 is constituted by a stacked pair line.

As shown in FIG. 13, the wiring board 86 includes, inside an insulating layer 91 (relative dielectric constant $\in_r$), the stacked pair lines 14₁, 14₂ and 14₃, a power source wire (power source paired ground line) 89 of Vss and a power source wire (power source paired ground line) 90 of Vdd. The power source wires 89 and 90 connect external terminals of the chip. The stacked pair lines 14₁, 14₂ and 14₃ are located above the power source wires 89 of Vss and the power source wire 90 of Vdd. The IC chip 11 shown in FIG. 12 includes pads 87. Receivers 16₁, 16₂ and 16₃ are each connected with a pair of pads 87. One of the pair of pads 87 of each of the receivers 16₁, 16₂ and 16₃ is connected to the upper wiring of the stacked pair lines 14₁, 14₂ and 14₃, respectively. The other of the pair of pads 87 of each of the receivers 16₁, 16₂ and 16₃ is connected to the lower wiring of the stacked pair lines 14₁, 14₂ and 14₃, respectively. FIG. 14 shows a condition where the connection is made in this manner. The connection is made by flip chip bonding. That is, the upper wires are connected to the pads 87 of the IC chip 11 through connection areas 93 provided on the insulating layer 91. The lower wires are connected to the pads 87 of the IC chip 11 through connection areas 92 exposed from the insulating layer 91. Further, it should be noted that the insulating layer 91 is integrally shown for simplification, however, as is the case with various wiring boards, the insulating layer 91 is constituted by a plurality of insulating layers.

The power source wires 89 and 90 are connected to connection areas provided on the insulating layer 91, and are connected to the IC chip 11 by flip chip bonding.

The IC chip 12 is also connected by flip chip bonding. The IC chip 12 is provided such that the IC chip 12 bridges over the stacked pair lines 14₁, 14₂ and 14₃. Pads 88 provided for each receiver 17 (in FIG. 12, only a receiver 17₁ is shown by continuous lines) are connected, by flip chip bonding, to connection areas connected to the transmission channel 14. The locations where the connection areas are provided are each equal in distance from the respective locations of the pads 87 of the IC chip 11. The stacked pair lines 14₁, 14₂ and 14₃ are terminated by terminal resistances $R_{T1}$, $R_{T2}$ and $R_{T3}$, respectively, each matching line characteristic impedance.

In FIG. 13, d represents the distance between the stacked pair lines, t represents the thickness of the stacked pair line, w represents the width of the upper wiring of the stacked pair line, s represents the distance between the adjacent sets of stacked pair lines, h1 represents the distance between the upper wiring of the stacked pair line and an exposed surface of the insulating layer 91, and h2 represents the distance between the lower wiring of the stacked pair line and the power source wire 89. It is preferable that the width of the lower wiring of the stacked pair line be about 1.2 to 1.5 times the width of the upper wiring. This is for avoiding deviation between the upper wiring and the lower wiring and preventing the electromagnetic field from affecting a lower layer. Additionally, in order to avoid crosstalk between the adjacent sets of stacked pair lines, it is preferable that w≦s be satisfied. From the same point of view, it is preferable that (d+t)≦s/2, d≦h1, and d≦2h2 be satisfied.

As mentioned above, since the stacked pair lines are used in the wiring board 86, it is necessary that the following requirements be met. First, the stacked pair lines 14₁, 14₂ and 14₃ are arranged with a pitch twice as long as that of the pads 87 and 88. Also, the pads 87 and 88 are arranged in a linear way and in a direction that is orthogonal to a direction in which the stacked pair lines 14₁, 14₂ and 14₃ extend. In a case where the pads 87 and 88 are provided to an IC chip itself, based on miniaturization of a chip area, the pitch between the pads 87 and that between the pads 88 becomes narrower. In this case, there is a possibility that the stacked pair lines 14₁, 14₂ and 14₃ cannot be preferably arranged.

Figure 15:
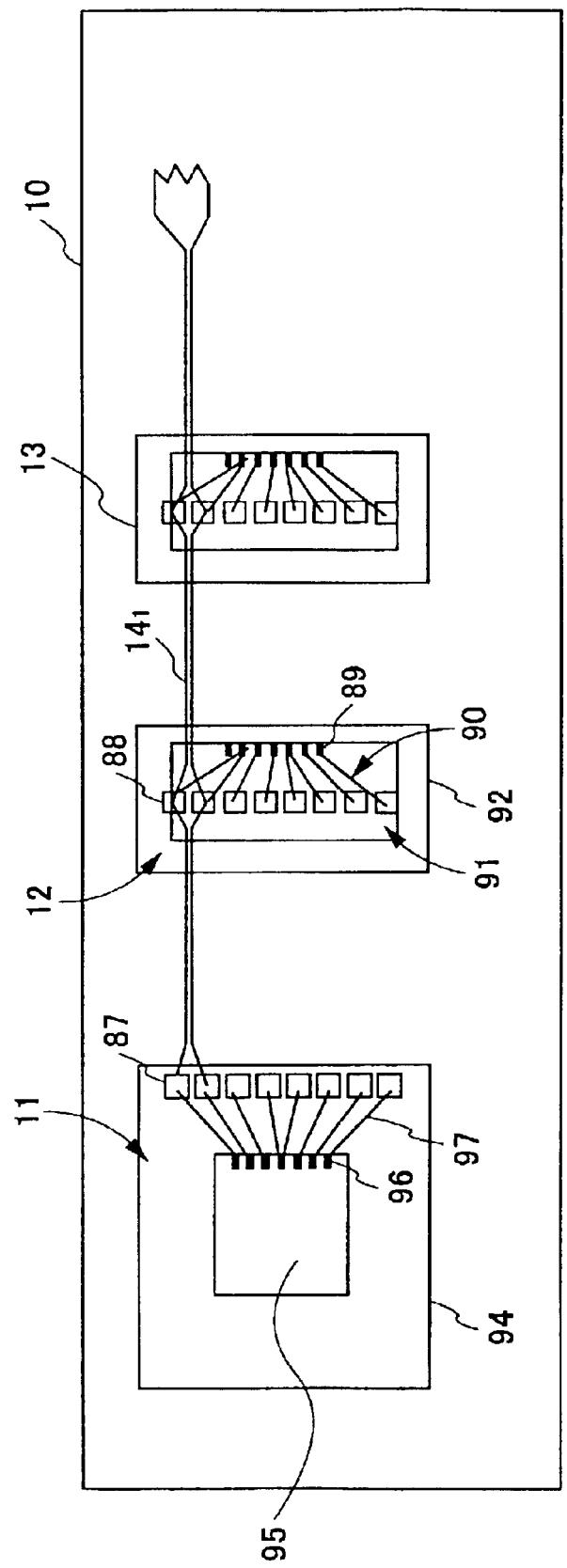
FIG. 15 is a schematic diagram showing an electronic device having model intermediate wires.

Considering such a case, it is preferable to provide intermediate wires connecting pads on an IC chip and pads on a package. FIG. 15 shows a model of the intermediate wires. In order to explain simply, in FIG. 15, the transmission channel 14 is shown as a coplanar line. The pads 88 are arranged in a line in the vicinity of the center of a package 92 of the IC chip 12. Pads 89 are arranged in a line on a chip 91. The pitch between the pads 89 is smaller than the pitch between the pads 88. The pads 88 and 89 are connected by intermediate wires 90. The IC chip 13 is constituted in a similar manner.

The IC chip 11 also uses intermediate wires 97 as the IC chips 12 and 13 do. The pads 87 arranged in a line at one side of a package 94 of the IC chip 11 and pads 96 arranged in a line on a chip 95 are connected by the intermediate wires 97.

Even when such intermediate wires 90 and 97 are used, in a high-speed signal system, it is required that all lines have the same characteristic impedance and the same length (equal-length wiring).

A consideration is given based on characteristic impedance of 28 Ω. Here, a case is assumed where the width w (refer to FIG. 13) of the stacked pair line is 200 μm, and the relative dielectric constant $\in_r$ is 4.5. When these values are substituted into an approximate expression (above-described equation (2)) of the characteristic impedance of the stacked pair line, the distance d between the two lines is d=39 μm (refer to FIG. 13 for d). Further, the approximate expression is as follows.

$$Z_0 = (377/\sqrt{\in})\{(w/d)\in +(1/\pi)ln(4)+\\ ((\in_r+1)/2\pi\in_r)ln(\pi\in(w/d)+0.94)/2\}+\\ ((\in-1)/2\pi\in_r^2)ln(\in_r^2/16)\}^{-1}\{\Omega\}$$

The loop including the transmission channel 14 and the branching transmission channels 15 and 16 have the transmission channel structures, and there is no characteristic impedance mismatching. In a case where the lines are arranged in parallel and having the same length (parallel-equal-length wiring), the pitch between pads is w/2 =100 μm, and can be designed with current technique. An ideal layer structure is obtained when the thickness h2 is 60 μm, which is the standard of a printed wiring board pre-preg.

On the other hand, it is necessary that the package wires are designed according to a pitch of pads on a chip. When the pitch is 50 μm, the width w of the stacked pair line on the package is 100 μm. According to the above-described equation (3), d=19.5 μm.

In this manner, the characteristic impedance of 28 Ω can be obtained over all lines.

Figure 16:
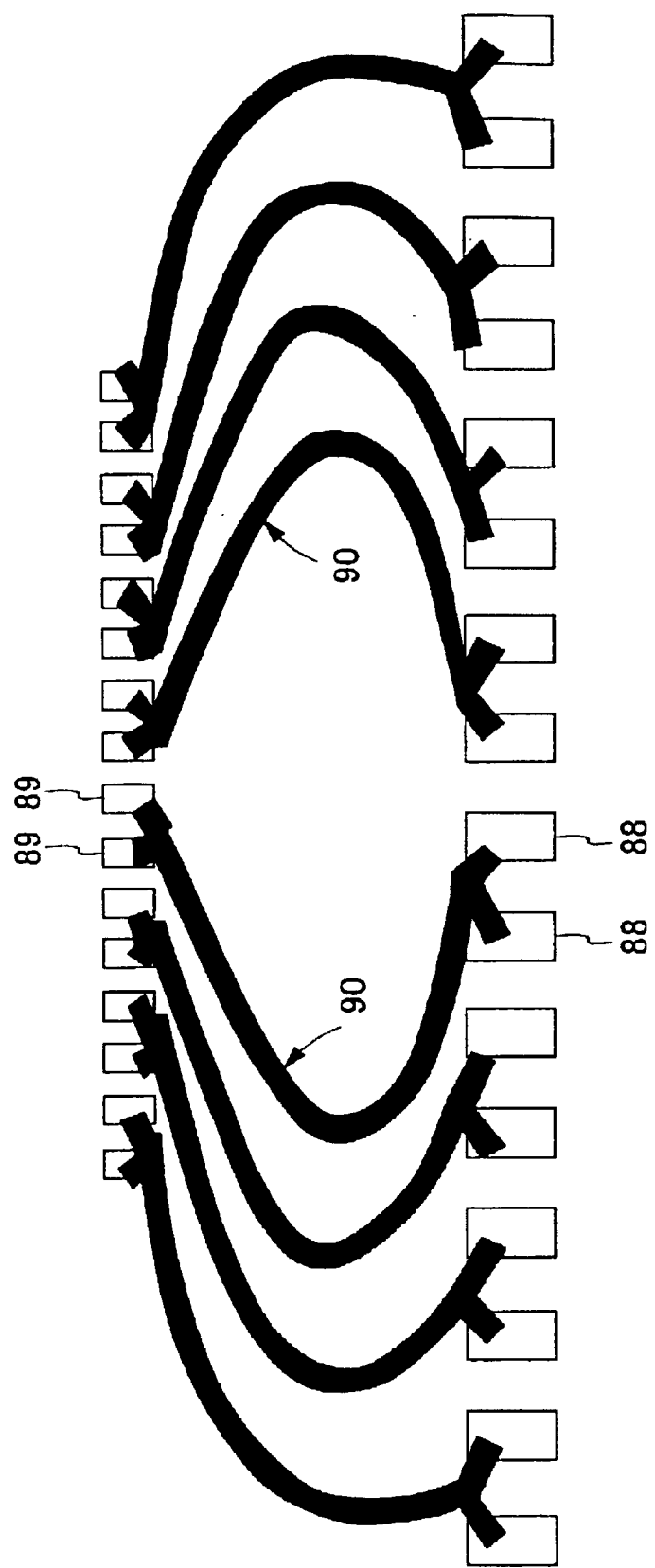
FIG. 16 is an enlarged plan view of the intermediate wires of FIG. 15.

In order to make each of the intermediate wires have the same length, the intermediate wires 90 are arranged as shown in FIG. 16. Other intermediate wires are arranged in a similar manner.

FIG. 16 is a plan view enlarging the part of the intermediate wires 90. Each of the intermediate wires 90 is constituted by a stacked pair line. In addition, each of the intermediate wires 90 has the same line length. That is, the intermediate wires 90 have a fan-out structure. In order to achieve the same line length, each of the intermediate wires 90 curves gently so that each of the intermediate wires 90 extends outward. The line length may be determined arbitrarily by adjusting the degree of the extension. Since the intermediate wires 90 are curved, there is no meandering such as a meander pattern. Thus, it is possible to perform smooth transmission. In addition, the distance between the adjacent lines can be made relatively wide, which is also advantageous for crosstalk. Further, it is possible to design the pads 88 on the package 92 and the pads 89 on the chip 91 independently.

Figure 17:
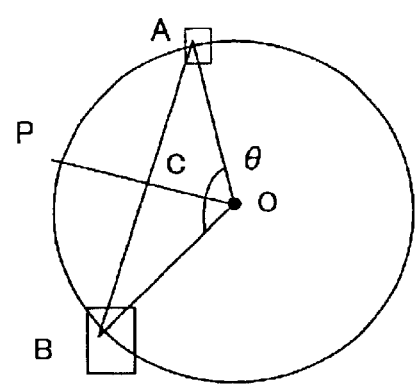
FIG. 17 is a schematic diagram showing a model for designing the curved shapes of the intermediate wires as arcs.

FIG. 17 is a diagram showing a model for designing the curved shape of each of the intermediate wires 90 to be an arc. The model is for making a chord AB variable, while an arc AB is kept constant. The chord $AB=1_1$ is a straight-line distance between the outermost pads. A relational expression having the chord AB as a variable and the arc AB as a constant, and finding a radius OP is discussed. When a segment $PC=r_1 \cdot h_1$ and a segment $OC=h_1$, $(1_1 \cdot 2)^2 = r_1^2 \cdot h_1^2$ is obtained, and from $\theta_1/2 = \tan^{-1}(1_1 \cdot 2h_1)$, the arc $AB = r_1 \theta_1$ [radian] is obtained. When $h_1$ is suitably determined, from the above equations, $r_1$ is obtained. While keeping the arc $AB=r_1\theta_1$ constant, $h_x$ and $r_x$ can be obtained for a distance $1_x$ between the next and following pads.

$$arc\ AB\ (constant) = \sqrt{r_x^2 \cdot (1_x/2)^2} \cdot \tan^{-1}(1_x/2\sqrt{r_x^2 \cdot (1_x/2)^2})$$

Of course, the arc AB may be an ellipse or an arbitrary curved line (FIG. 16) of a higher order. The arc AB may have any shape as long as the shape does not possess a complex transmission property pertaining to an electromagnetic field.

Figure 18:
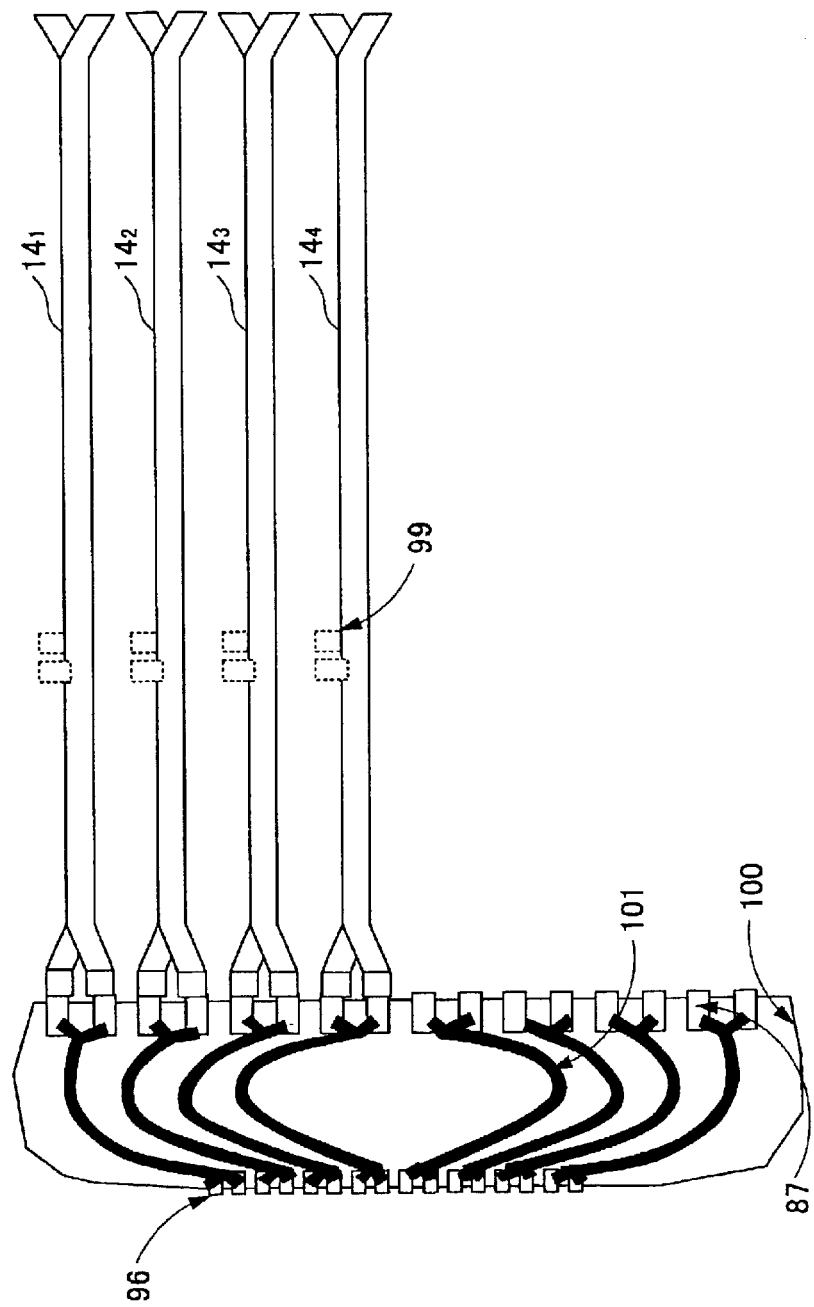
FIG. 18 is a schematic diagram showing one embodiment of the present invention in which the intermediate wires are constituted by microstriplines.

The intermediate wires may be constituted by microstriplines. FIG. 18 shows an embodiment where the intermediate wires are constituted by microstriplines. The transmission channels $14_1$ through $14_4$ of stacked pair lines are connected to the corresponding pads 87. The pads 87 are provided on a completely-filled ground 100. Intermediate wires 101 constituted by microstiplines connect the pads 87 and pads on a chip 96.

A stripline such as a microstripline has characteristics that an electric field expands with respect to the ground and the capacitance $C_0$ per unit length is increased. Therefore, impedance $$Z_0 = \sqrt{L_0/C_0}$$

becomes small with the same line width w. Conversely, when $Z_0$ is constant, the line width w can be made small. An approximate expression of the characteristic impedance of a microstip line is as follows. It should be noted that the definitions of the symbols are the same as those explained with reference to FIG. 13.

$$Z_0 = (377/2.828\pi\sqrt{\varepsilon_r} + 1)\ln\{1 + (4d/w[((14 + 8/\varepsilon_r)/11)(4d/w) + \sqrt{((14 + 8/\varepsilon_r)11)^2(4h/w)^2 + \pi^2(1 + 1/\varepsilon_r)2]})\}\ [\Omega] \quad \text{Equation (4)}$$

When $Z_0$ is 28 Ω, w=170 μm where d=39 μm. Correction of the thickness of the wiring t=25 μm may be performed by subtracting 25 μm from the width w, according to experience. The width w after the correction is w=145 μm. It is possible to miniaturize the width w as small as w=145 μm, when microstriplines are used instead of stacked pair lines having the width w=200 μm and the distance d between the lines is d=39 μm as is in the case of the stacked pair lines. It is rather difficult to say that the width of 145 μm is enough for the design where the pitch of the pads 96 on the chip is 50 μm and the width w of the intermediate wiring 101 is 100 μm. However, by reducing the width of each of the intermediate wires near the pads 96, it is possible to respond to the problem. The same idea as the branching line length may be applied to the line length to be wired. That is, a condition: (6×(total delay time in the length to be wired)<(risetime of a waveform) should be satisfied.

As described above, by a combination of the stacked pair lines 141 through 144 and the intermediate wires 101, it is possible to vary the width w of the line while maintaining the distance d between the pair lines (the upper line and the lower line) of a stacked pair line constant. Such wires can be preferably applied to a structure where a chip is directly mounted on a wiring board without using a package.

In the construction shown in FIG. 2 and the like, the driver 16 is connected at the end of the bus. However, the present invention also includes a construction in which the driver 16 is provided in the middle of (not at the end of) the transmission channel 14.

Figure 19:
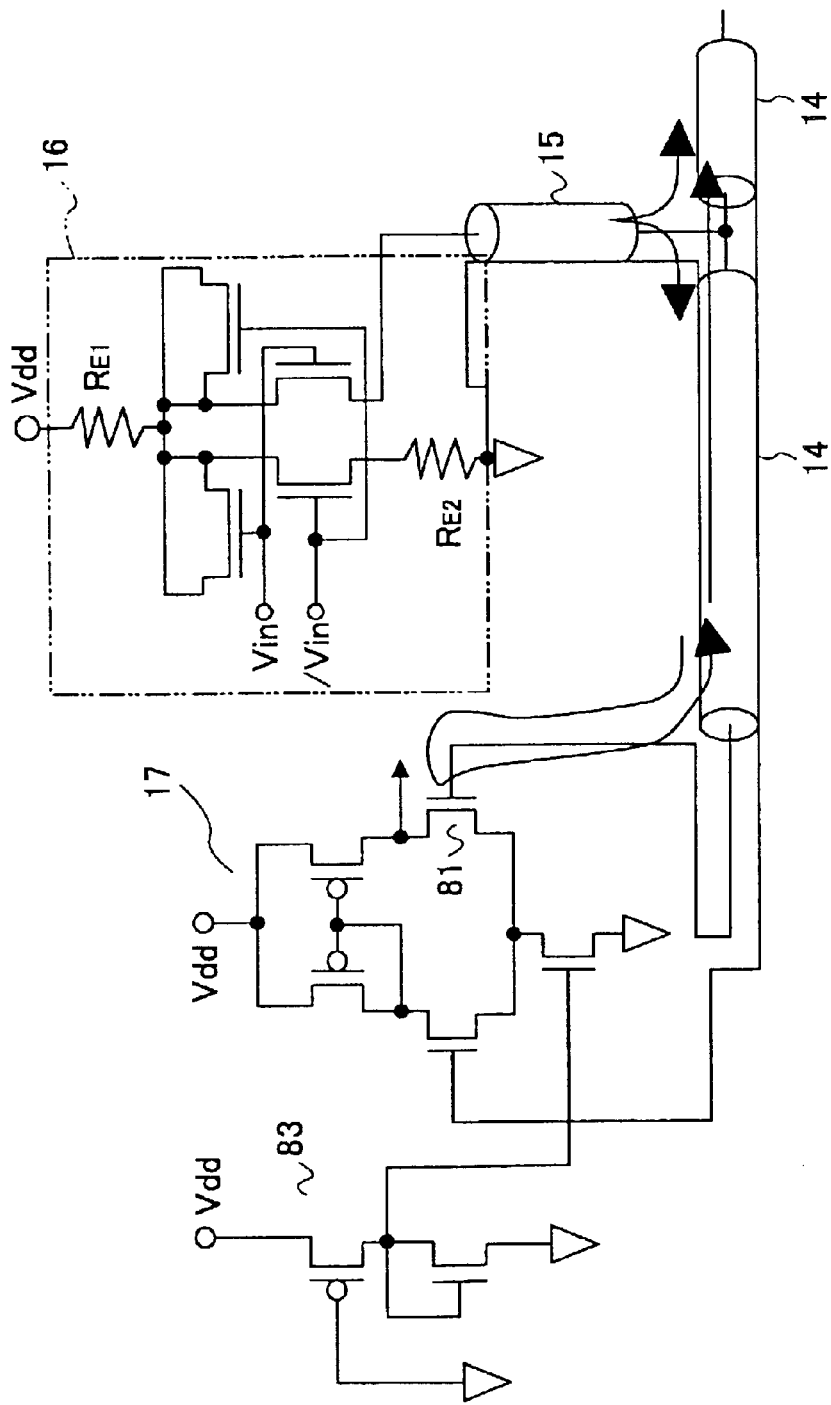
FIG. 19 is a circuit diagram showing a circuit configuration in which the driver 16 is provided in the middle of a transmission channel.

FIG. 19 shows such a structure. In FIG. 19, those parts that are the same as the above-described parts are designated by the same reference numerals. The driver 16 is connected to the middle of the transmission channel 14 through the branching transmission channel 15. A signal output by the driver 16 passes the branching transmission channel 15 and is propagated through the transmission channel 14 in both directions. Since the transmission channel 14 has equal characteristic impedance in the right side and the left side of FIG. 19, according to the energy conservation law, signal voltage is halved. A signal propagated to the right side of FIG. 19 is absorbed by a terminal resistance (not shown in FIG. 19) and is extinguished. A signal propagated to the left side of FIG. 19 is input to the receiver 17. The gate of the transistor 81 constituting the receiver 17 has a capacity equal to or less than 10 fF. Thus, the gate is regarded as an open end, and signal energy is totally reflected. Accordingly, the signal voltage appears to be doubled, and the receiver 17 operates at a correct voltage. The signal energy that is totally reflected returns to the right side of FIG. 19 again. When the reflected signal energy reaches a transmission branch point, if the driver 16 is in operation, the driver 16 is sending a saturation power current. Consequently, when seen from the outside, the transmission branch point has high impedance. Thus, the reflected signal energy further proceeds to the right side without affecting the driver 16 and is extinguished at the terminal resistance. On the other hand, when the reflected signal energy reaches the transmission branch point, if the driver 16 has already ended transmission, the transmission branch point has the same high impedance as that of other branch points not in operation. Thus, there is no problem.

The construction of FIG. 19 includes a construction in which the IC chip 11 of FIG. 2 includes the driver 17 and the current setting part 83, and the IC chips 12 and 13 are equipped with the driver 16. That is, the construction in which a bus of one bit transmits a signal in both directions (in other words, a two-way bus).

FIG. 20 shows the IC chip 11 having such a construction. The IC chip 11 is equipped with a receiver 117 and a current setting part 118 in addition to the driver 16. The receiver 117 and the current setting part 118 have the same constructions as those of the receiver 17 and the current setting part 83, respectively, which are shown in FIG. 11. The receiver 117 and the transmission channel 14 are connected through pMOS transistors 120 and 121. The gates of the transistors 120 and 121 are controlled by the input signal Vin.

The IC chip 12 having the receiver 17 and a driver 127 is connected to the middle of the transmission channel 14. Similarly, the IC chip 13 having the receiver 18 and a driver 128 is connected to the middle of the transmission channel 14.

The present invention is not limited to the specifically disclosed embodiments, and variations and modifications may be made without departing from the scope of the present invention.

For example, the present invention includes an embodiment in which bipolar transistors are used instead of the MOS transistors.

The present application is based on Japanese priority application No. 2001-369358 filed on Dec. 3, 2001, the entire contents of which are hereby incorporated by reference.

What is claimed is:

1. An electronic device comprising a current switch type driver including a differential circuit that supplies a current to a transmission channel according to a signal,
   wherein a signal wire transmitting the signal to the differential circuit has a transmission channel structure, and
   wherein a plurality of varactors are connected to the differential circuit.

2. The electronic device as claimed in claim 1, wherein the signal wire has a coplanar line structure.

3. The electronic device as claimed in claim 1, wherein the signal wire has a coplanar line structure and extends close to a control electrode of a transistor constituting the differential circuit.

4. The electronic device as claimed in claim 1, further comprising:
   another wire at a location distant from the signal wire,
   wherein the signal wire has a coplanar line structure in which two lines are twinned, and the distance between the other wire and the signal wire is equal to or more than 1.5 times the distance between the two twinned lines.

5. The electronic device as claimed in claim 1, further comprising:
   a power source paired ground line having a transmission channel structure.

6. The electronic device as claimed in claim 1, further comprising:
   a power source paired ground line having a coplanar line structure in which two lines are twinned,
   wherein the signal wire has a coplanar line structure in which two lines are twinned, and the power source paired ground line constitutes an upper layer of the signal wire.

7. The electronic device as claimed in claim 1,
   wherein the plurality of varactors are elements whose capacities are varied in response to the signal and the plurality of varactors give an electric charge to the differential circuit and receives the electric charge from the differential circuit.

8. The electronic device as claimed in claim 1, further comprising:
   an electronic component connected to the transmission channel,
   wherein said electronic component and the transmission channel are connected by a wire having a transmission channel structure other than a coplanar line structure.

9. The electronic device as claimed in claim 1, further comprising:
   an electronic component connected to the transmission channel,
   wherein said electronic component and the transmission channel are connected by a wire having a stacked pair line structure.

10. The electronic device as claimed in claim 1, further comprising:
    an electronic component connected to the transmission channel, wherein terminals on a chip in said electronic component and external terminals for connecting to the transmission channel are connected by wires each having a transmission channel structure.

11. The electronic device as claimed in claim 1, further comprising:
    an electronic-component connected to the transmission channel,
    wherein terminals on a chip in the electronic component and external terminals for connecting to the transmission channel are connected by wires each having a stacked pair line structure.

12. The electronic device as claimed in claim 1, further comprising:
    an electronic component connected to the transmission channel,
    wherein terminals on a chip in said electronic component and external terminals for connecting to the transmission channel are connected by wires each having a stripline structure.

13. The electronic device as claimed in claim 10, wherein the wires connecting the terminals on the chip and the external terminals for connecting to the transmission channel include a plurality of signal wires having the equal length.

14. The electronic device as claimed in claim 11, wherein the wires connecting the terminals on the chip and the external terminals for connecting to the transmission channel include a plurality of signal wires having the equal length.

15. The electronic device as claimed in claim 12, wherein the wires connecting the terminals on the chip and the external terminals for connecting to the transmission channel include a plurality of signal wires having the equal length.

16. The electronic device as claimed in claim 10, wherein the wires connecting the terminals on the chip and the external terminals for connecting to the transmission channel include signal wires having the equal length and having an arc shape.

17. The electronic device as claimed in claim 11, wherein the wires connecting the terminals on the chip and the external terminals for connecting to transmission channel include signal wires having the equal length and having an arc shape.

18. The electronic device as claimed in claim 12, wherein the wires connecting the terminals on the chip and the external terminals for connecting to the transmission channel include signal wires having the equal length and having an arc shape.

19. The electronic device as claimed in claim 1, wherein the transmission channel includes a signal wire having a stacked pair line structure and transmitting a signal, and a power source paired ground line having the stacked pair line structure.

20. The electronic device as claimed in claim 15, wherein the power source paired ground line connects external terminals and is arranged underneath the signal wire.

21. The electronic device as claimed in claim 1, further comprising:
    a terminal circuit at one end of the transmission channel.

22. The electronic device as claimed in claim 1, further comprising:
    an electronic component connected to the transmission channel,
    wherein a branch transmission channel connecting the transmission channel and said electronic component has a length satisfying a condition that a risetime of a waveform of a signal on the transmission channel is greater than the delay time occurring when the signal makes "n" round-trips through said branch transmission channel, where "n" is a predetermined number.

23. The electronic device as claimed in claim 1, further comprising:

a receiver receiving a signal from the transmission channel.

* * * * *